United States Patent
Pinarbasi

(12) 
(10) Patent No.: US 6,735,061 B2
(45) Date of Patent: May 11, 2004

(54) READ HEAD SENSOR WITH A REACTIVELY SPUTTERED PINNING LAYER STRUCTURE

(75) Inventor: Mustafa Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 79 days.

(21) Appl. No.: 10/144,118

(22) Filed: May 13, 2002

(65) Prior Publication Data

US 2002/0159198 A1 Oct. 31, 2002

Related U.S. Application Data

(62) Division of application No. 09/366,942, filed on Aug. 4, 1999.

(51) Int. Cl.$^7$ .............................................. G11B 5/127
(52) U.S. Cl. ................................................ 360/324.11
(58) Field of Search ......................... 360/324.11, 324.1, 360/317

(56) References Cited

U.S. PATENT DOCUMENTS

| | | | | |
|---|---|---|---|---|
| 4,219,853 A | * | 8/1980 | Albert et al. ............ 360/234.5 |
| 5,492,605 A | | 2/1996 | Pinarbasi ............... 204/192.11 |
| 5,688,380 A | | 11/1997 | Koike et al. ............. 204/192.2 |
| 5,696,656 A | * | 12/1997 | Gill et al. .................... 360/113 |
| 5,698,335 A | * | 12/1997 | Iwasaki et al. ............. 428/611 |
| 5,701,223 A | * | 12/1997 | Fontana, Jr. et al. ........ 360/113 |
| 5,783,262 A | | 7/1998 | Chaiken et al. ............. 427/529 |
| 5,871,622 A | | 2/1999 | Pinarbasi ............... 204/192.11 |
| 5,923,504 A | * | 7/1999 | Araki et al. ................. 360/113 |
| 6,114,850 A | * | 9/2000 | Hayashi ...................... 324/252 |

FOREIGN PATENT DOCUMENTS

| | | | |
|---|---|---|---|
| EP | 762389 | | 3/1997 |
| JP | 62-154212 | * | 7/1987 |
| JP | 7-220246 | | 8/1995 |
| JP | 9-083039 | | 3/1997 |
| WO | WO 9711499 | | 3/1997 |

OTHER PUBLICATIONS

M. Sano et al, "Exchange Coupling and GMR Properties in Ion Bean Sputtered Hematite Spin–Valves", *IEEE Transactions on Magnetics*, vol. 34, No. 2, Mar. 1996.

* cited by examiner

*Primary Examiner*—George J. Letscher
(74) *Attorney, Agent, or Firm*—Ervin F. Johnston

(57) ABSTRACT

A pinning layer structure is provided for a spin valve sensor of a read head which has a reactively deposited nickel oxide first film which underlies a reactively sputter deposited second film of iron oxide ($Fe_2O_3$) or ($Fe_3O_4$). In the preferred embodiment the pinning layer is composed of cobalt (Co) or cobalt iron (CoFe) which is exchange coupled to the iron oxide ($Fe_2O_3$) or ($Fe_3O_4$) second film of the pinning layer. This structure results in an improved magnetoresistive coefficient (dr/R) which is substantially maintained after annealing so that the magnetic head has good thermal stability when subjected to high temperatures in the presence of a field that is antiparallel to the pinned orientation of the magnetic moment of the pinned layer.

8 Claims, 23 Drawing Sheets

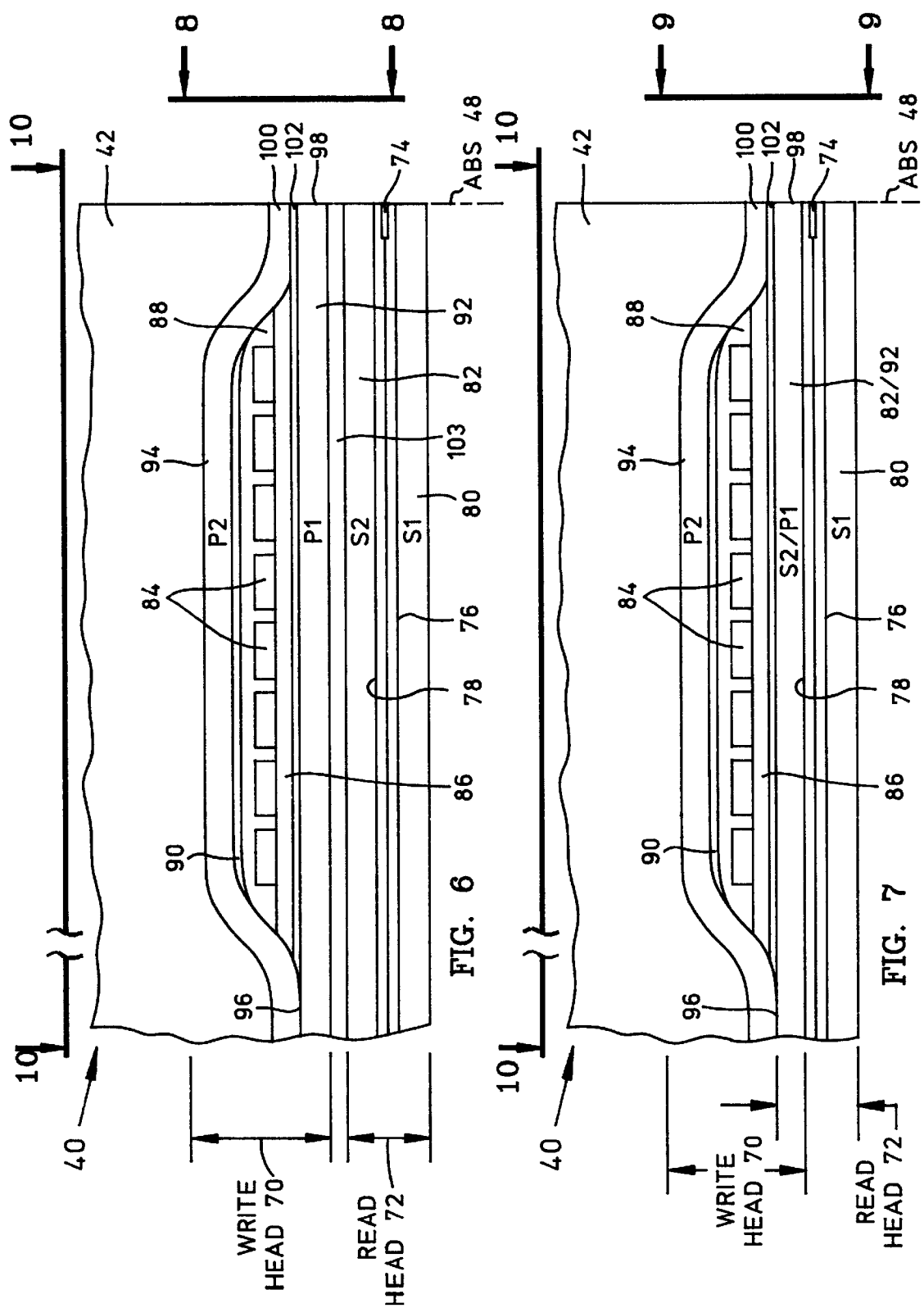

(ABS)

READ HEAD SENSOR WITH A REACTIVELY SPUTTERED PINNING LAYER STRUCTURE

CROSS-REFERENCE TO RELATED APPLICATION

This application is a divisional application of copending application Ser. No. 09/366,942 filed Aug. 4, 1999.

BACKGROUND OF THE INVENTION

1. Field of the Invention

The present invention relates to a magnetic read head sensor with a reactively sputtered pinning layer structure and more particularly to a pinning layer structure that has a nickel oxide (NiO) first film and an iron oxide ($Fe_2O_3$) or ($Fe_3O_4$) second film that are reactively sputtered for increasing an exchange coupling field between the pinning layer structure and a pinned layer structure.

2. Description of the Related Art

A spin valve sensor is employed by a read head for sensing magnetic signal fields from a moving magnetic medium, such as a rotating magnetic disk. The sensor includes a nonmagnetic electrically conductive first spacer layer sandwiched between a ferromagnetic pinned layer and a ferromagnetic free layer. An antiferromagnetic pinning layer interfaces the pinned layer for pinning a magnetic moment of the pinned layer 90° to an air bearing surface (ABS) which is an exposed surface of the sensor that faces the magnetic disk. First and second leads are connected to the spin valve sensor for conducting a sense current therethrough. A magnetic moment of the free layer is free to rotate upwardly and downwardly with respect to the ABS from a quiescent or bias point position in response to positive and negative magnetic field signals from a rotating magnetic disk. The quiescent position, which is typically parallel to the ABS, is the position of the magnetic moment of the free layer with the sense current conducted through the sensor in the absence of signal fields.

The thickness of the spacer layer is chosen so that shunting of the sense current and a magnetic coupling between the free and pinned layers are minimized. This thickness is typically less than the mean free path of electrons conducted through the sensor. With this arrangement, a portion of the conduction electrons are scattered at the interfaces of the spacer layer with the pinned and free layers. When the magnetic moments of the pinned and free layers are parallel with respect to one another scattering is minimal and when their magnetic moments are antiparallel scattering is maximized. Changes in scattering changes the resistance of the spin valve sensor as a function of $\cos\theta$, where $\theta$ is the angle between the magnetic moments of the pinned and free layers. The sensitivity of the sensor is quantified as magnetoresistive coefficient dr/R where dr is the change in the resistance of the sensor as the magnetic moment of the free layer rotates from a position parallel to the magnetic moment of the pinned layer to an antiparallel position thereto and R is the resistance of the sensor when the magnetic moments are parallel.

Because of the interfacing of the pinning and pinned layers the pinned layer is exchange coupled to the pinning layer. A unidirectional orientation of the magnetic spins of the pinning layer pins the magnetic moment of the pinned layer in the same direction. The orientation of the magnetic spins of the pinning layer are set by applying heat at or above a blocking temperature of the material of the pinning layer in the presence of a field that is directed in the desired pinned direction. The pinned direction is typically perpendicular to the ABS. The blocking temperature is the temperature at which all of the magnetic spins of the pinning layer are free to rotate in response to an applied field. During the setting, the magnetic moment of the pinned layer is oriented parallel to the applied field and the magnetic spins of the pinning layer follow this orientation. When the heat is reduced below the blocking temperature the magnetic spins of the pinning layer pin the orientation of the magnetic moment of the pinned layer. The pinning function is effective as long as the temperature remains substantially below the blocking temperature.

Nickel oxide (NiO) is a desirable material for the aforementioned pinning layer structure. Since nickel oxide (NiO) is insulating it can function as a portion of the first read gap layer thereby enhancing the insulating properties of the first read gap of the read head. Unfortunately, nickel oxide (NiO) has a relatively low blocking temperature which is about 220° C. In a magnetic disk drive the operating temperature may exceed 150° C. A portion of the magnetic spins of the nickel oxide (NiO) pinning layer rotate below the blocking temperature because of a blocking temperature distribution below the blocking temperature where portions of the magnetic spins of the pinning layer commence to rotate. Accordingly, a portion of the magnetic spins of the nickel oxide (NiO) pinning layer can rotate at operating temperatures in the presence of a magnetic field, such as a signal field from the rotating magnetic disk, the write field from the write head or an unwanted electric static discharge (ESD) caused by contact with a statically charged object. The problem is exacerbated when the slider contacts an asperity on the magnetic disk which can raise the temperature above the disk drive operating temperature.

In the presence of some magnetic fields the magnetic moment of the pinned layer can be rotated antiparallel to the pinned direction. The question then is whether the magnetic moment of the pinned layer will return to the pinned direction when the magnetic field is relaxed. This depends upon the strength of the exchange coupling field and the coercivity of the pinned layer. If the coercivity of the pinned layer exceeds the exchange coupling field, the exchange coupling field will not be strong enough to bring the magnetic moment of the pinned layer back to the original pinned direction. Until the magnetic spins of the pinning layer are reset the read head is rendered inoperative. Accordingly, there is a strong felt need to increase the exchange coupling field between a nickel oxide (NiO) pinning layer and a pinned layer so that the sensor has improved thermal stability.

SUMMARY OF THE INVENTION

The present invention includes a pinning layer structure that has a reactively sputtered nickel oxide (NiO) first film that underlies a reactively sputtered iron oxide ($Fe_2O_3$) or ($Fe_3O_4$) second film. The iron oxide second film interfaces a pinned layer so that the pinned layer is exchange coupled to the pinning layer. In a preferred embodiment the pinned layer includes a cobalt (Co) or cobalt iron (CoFe) layer sputter deposited on the iron oxide layer. With a pinned layer structure comprising a nickel iron (NiFe) layer and a cobalt iron (CoFe) layer on the aforementioned pinning layer structure the magnetoresistive coefficient dr/R was 5.07% after setting the magnetic moment of the pinned layer structure perpendicular to the ABS and before annealing, and was 4.72% after annealing at a temperature of 230° C. for 11 hours in the presence of a field of 500 Oe. With a nickel iron (NiFe) pinned layer on a typical nickel oxide (NiO) pinning layer the magnetoresistance coefficient dr/R was 5.28% after setting and before annealing and was 4.50% after annealing. Accordingly, the magnetoresistive coefficient dr/R of the read head with the improved pinning layer structure increased from 4.50% to 4.72% after annealing. This is due to the improvement of the exchange coupling field between the pinned layer and the present pinning layer structure. In still a further preferred embodiment the pinned layer is cobalt (Co) or cobalt iron (CoFe). When the pinned layer was a single cobalt iron (CoFe) layer on the present pinning layer structure the initial magnetoresistive coefficient dr/R was 5.54% and after annealing the magnetoresistive coefficient dr/R was 5.42%. This embodiment demonstrates a significant improvement in the magnetoresistive coefficient dr/R.

The improved pinning layer structure is formed in a sputtering chamber that has an ion beam gun for directing a beam of an ionized noble gas, such as argon (Ar), on a target. In a preferred embodiment of the method of making, the first target is nickel (Ni) and the second target is iron (Fe). Oxygen is provided in the chamber either through an ion gun or an inlet. When the ion beam is directed on the nickel (Ni) target nickel atoms are sputtered from the target onto a wafer where the oxygen reacts with the nickel atoms to form the nickel oxide (NiO) first film. The ion beam is then directed on the iron (Fe) target which causes iron (Fe) atoms to be sputtered onto the nickel oxide (NiO) first film and reacted with oxygen to form a second film of iron oxide ($Fe_2O_3$) or ($Fe_3O_4$). In the preferred embodiment the ion beam is then directed on a target of cobalt (Co) or cobalt iron (CoFe) which is sputter deposited on the iron oxide ($Fe_2O_3$) or ($Fe_3O_4$) second film. The pinned layer structure can be a simple pinned layer or an antiparallel (AP) pinned layer structure which will be discussed in more detail in the detailed description.

An object of the present invention is to provide a reactively sputtered pinning layer that has increased exchange coupling with a pinned layer of a spin valve sensor.

Other objects and attendant advantages of the invention will be appreciated upon reading the following description taken together with the accompanying drawings.

BRIEF DESCRIPTION OF THE DRAWINGS

FIG. 6 is a partial view of the slider and a piggyback magnetic head as seen in plane 6—6 of FIG. 2;

FIG. 7 is a partial view of the slider and a merged magnetic head as seen in plane 7—7 of FIG. 2;

DESCRIPTION OF THE PREFERRED EMBODIMENTS

Magnetic Disk Drive

Figure 1:
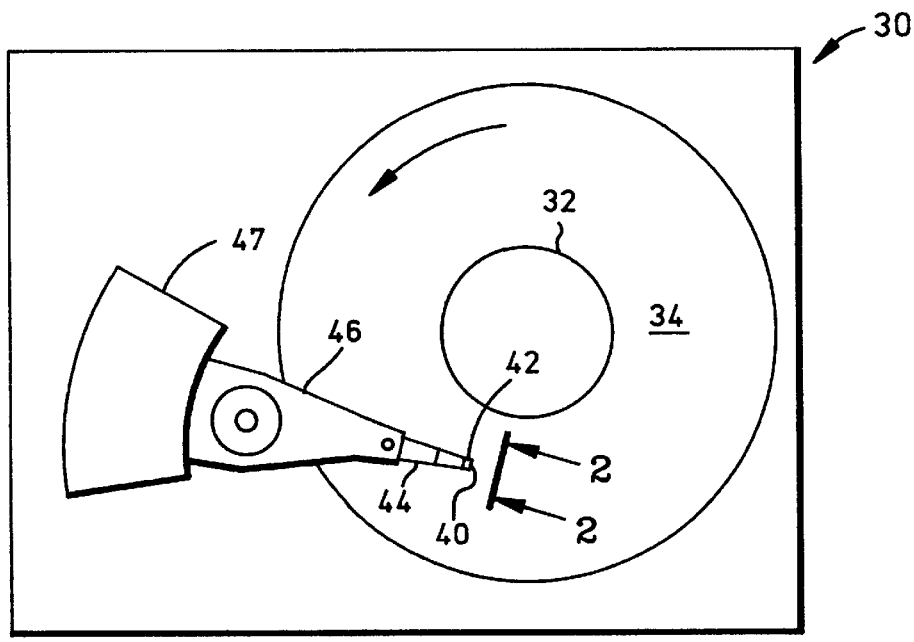
FIG. 1 is a plan view of an exemplary magnetic disk drive.
Figure 2:
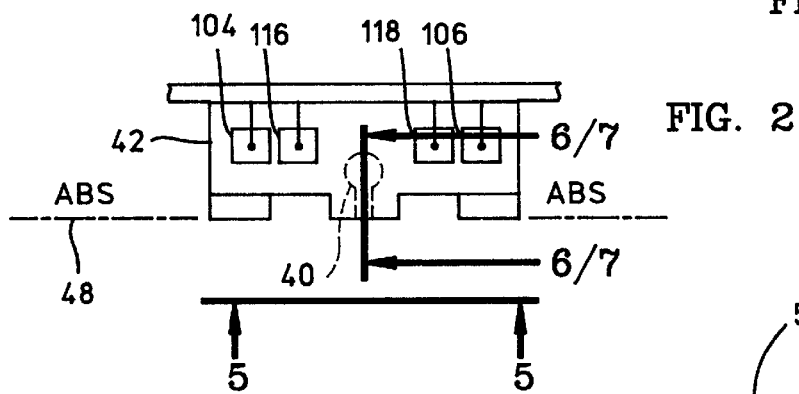
FIG. 2 is an end view of a slider with a magnetic head of the disk drive as seen in plane 2—2.
Figure 3:
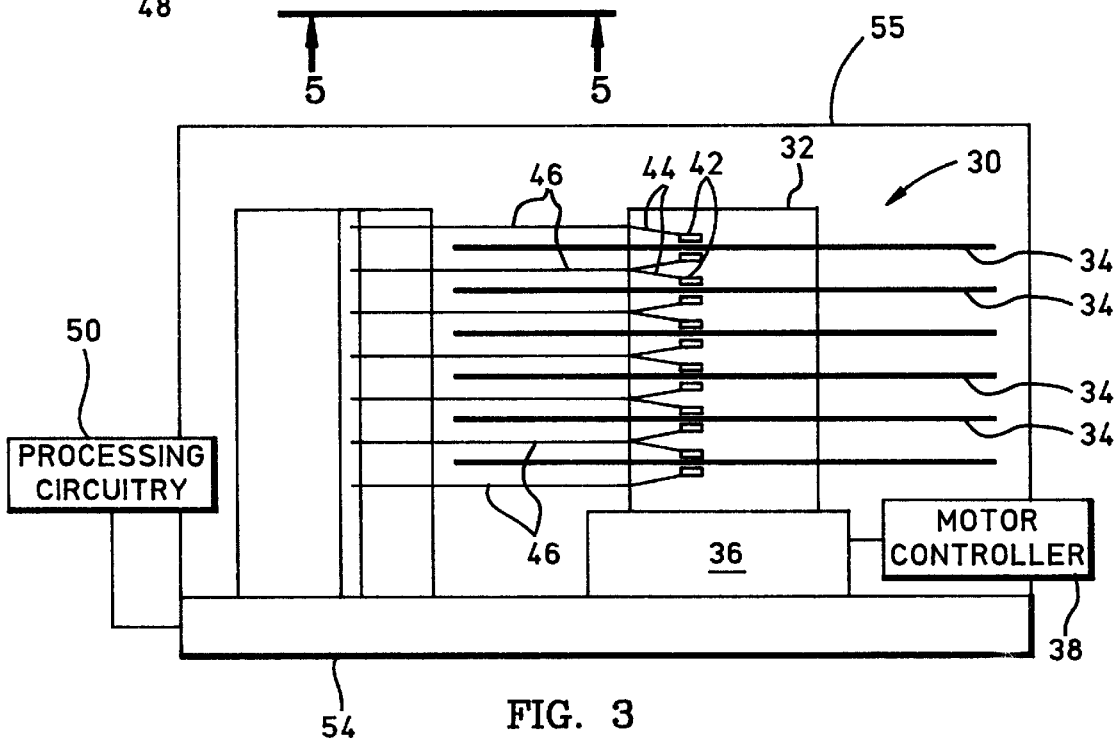
FIG. 3 is an elevation view of the magnetic disk drive wherein multiple disks and magnetic heads are employed.
Figure 4:
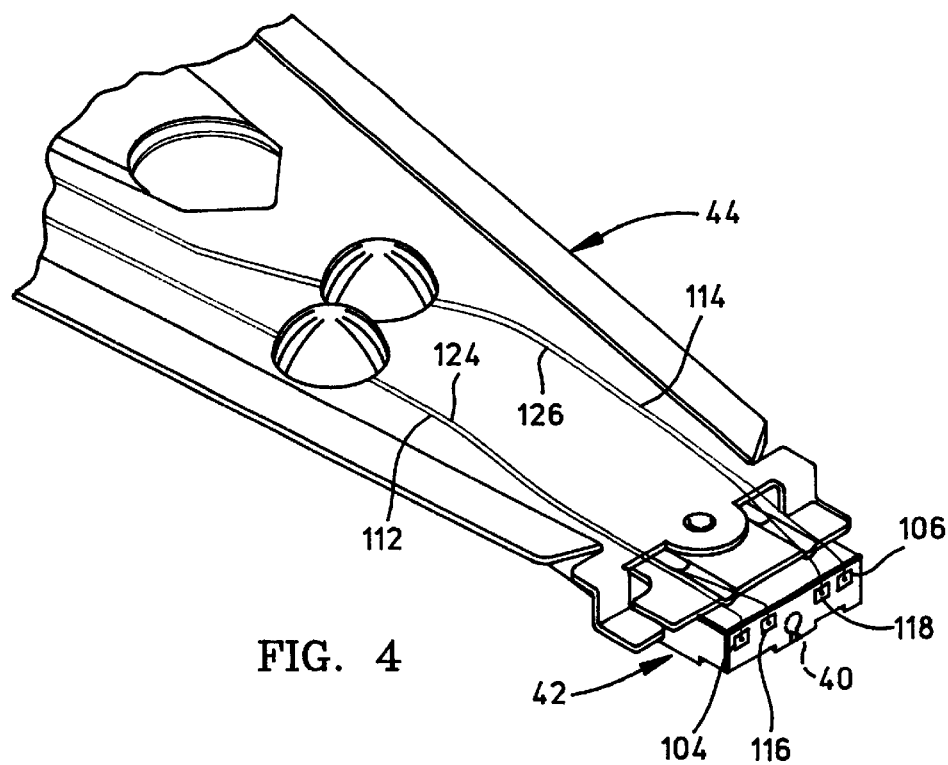
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 supports a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.05 $\mu$m) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
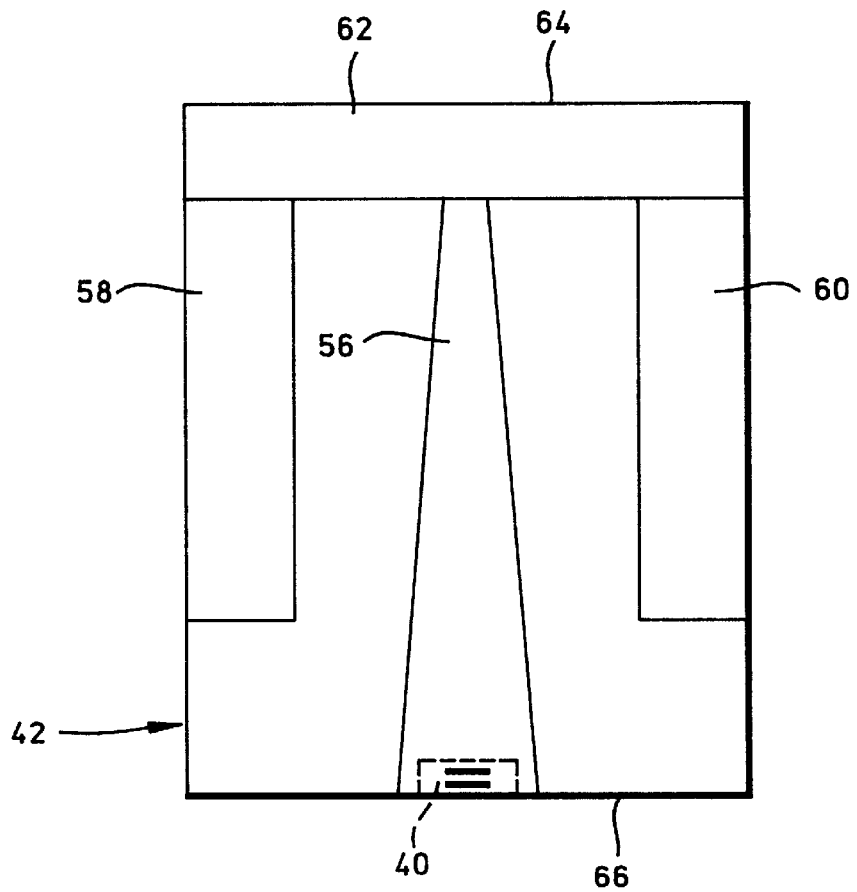
FIG. 5 is an ABS view of the slider taken along plane 5—5 of FIG. 2.

FIG. 5 is an ABS view of the slider 42 and the magnetic head 40. The slider has a center rail 56, which supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 8:
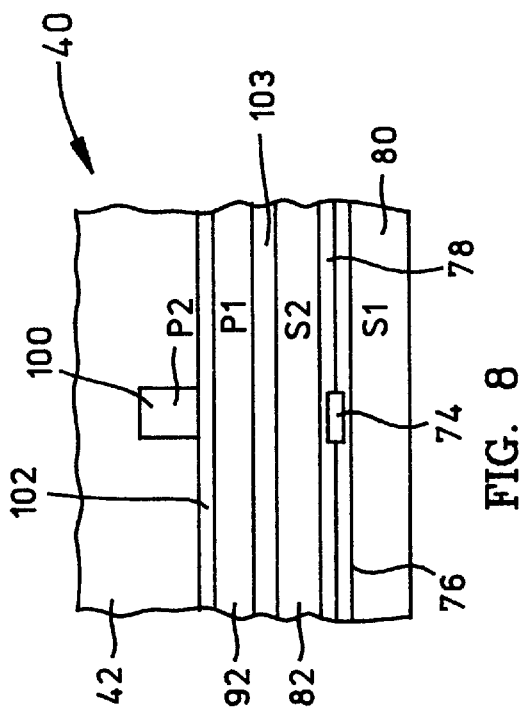
FIG. 8 is a partial ABS view of the slider taken along plane 8—8 of FIG. 6 to show the read and write elements of the piggyback magnetic head.

FIG. 6 is a side cross-sectional elevation view of a piggyback magnetic head 40, which includes a write head portion 70 and a read head portion 72, the read head portion employing a spin valve sensor 74 of the present invention. FIG. 8 is an ABS view of FIG. 6. The spin valve sensor 74 is sandwiched between nonmagnetic electrically insulative first and second read gap layers 76 and 78, and the read gap layers are sandwiched between ferromagnetic first and second shield layers 80 and 82. In response to external magnetic fields, the resistance of the spin valve sensor 74 changes. A sense current $I_S$ conducted through the sensor causes these resistance changes to be manifested as potential changes. These potential changes are then processed as readback signals by the processing circuitry 50 shown in FIG. 3.

Figure 10:
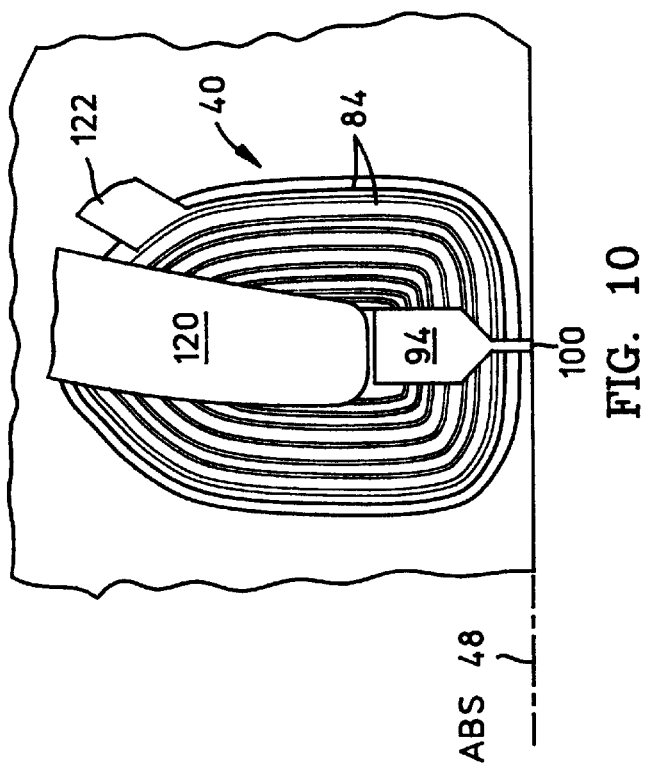
FIG. 10 is a view taken along plane 10—10 of FIGS. 6 or 7 with all material above the coil layer and leads removed.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

Figure 9:
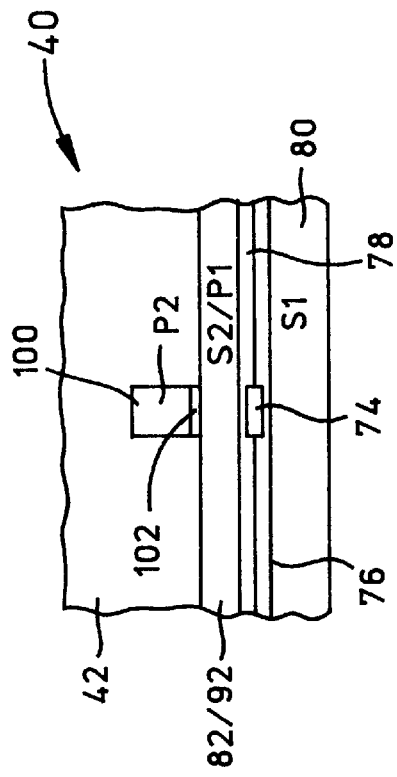
FIG. 9 is a partial ABS view of the slider taken along plane 9—9 of FIG. 7 to show the read and write elements of the merged magnetic head.

FIGS. 7 and 9 are the same as FIGS. 6 and 8 except the second shield layer 82 and the first pole piece layer 92 are a common layer. This type of head is known as a merged magnetic head. The insulation layer 103 of the piggyback head in FIGS. 6 and 8 is omitted.

Figure 11:
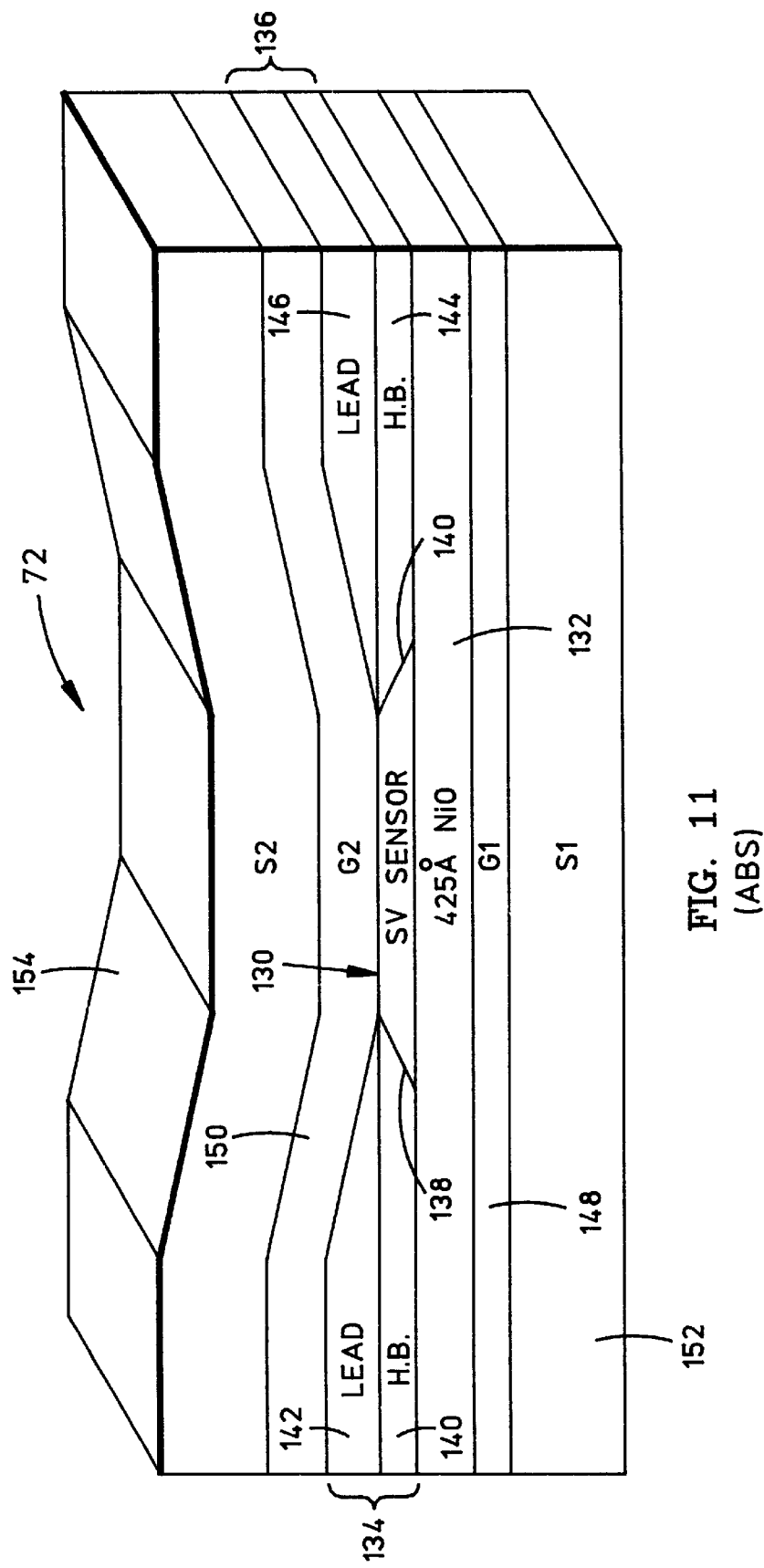
FIG. 11 is an isometric ABS illustration of a read head which employs a spin valve sensor.

FIG. 11 is an isometric ABS illustration of a read head 72 which has a spin valve sensor 130. First and second hard bias and lead layers 134 and 136 are connected to first and second side edges 138 and 140 of the spin valve sensor. This connection is known in the art as a contiguous junction and is fully described in commonly assigned U.S. Pat. No. 5,018,037. The first hard bias and lead layers include a first hard bias layer 140 and a first lead layer 142 and the second hard bias and lead layers 136 include a second hard bias layer 144 and a second lead layer 146. The hard bias layers 140 and 144 cause magnetic flux to extend longitudinally through the spin valve sensor 130 for stabilizing magnetic domains of the free layer. The spin valve sensor 130 and the first and second hard bias and lead layers 134 and 136 are located between nonmagnetic electrically insulative first and second read gap layers 148 and 150. The first and second read gap layers 148 and 150 are, in turn, located between first and second shield layers 152 and 154.

EXAMPLES

Five examples of a spin valve sensor were tested wherein Examples 3, 4 and 5 are exemplary of the present invention. In the examples various films were employed for the antiferromagnetic (AFM) pinning layer and various films were employed for the pinned layer exchange coupled thereto. Each example included a complete spin valve sensor wherein only the various aforementioned films were varied. The first film of the pinning layer in each of the examples was nickel oxide (NiO). After completion of each spin valve sensor the magnetic spins of the pinning layer were set perpendicular to the ABS by applying a field of about 12,000 Oe perpendicular to the ABS for 15 minutes at a temperature of 220° C. The magnetoresistive coefficient (dr/R) of each head was then measured which is referred to as the initial magnetoresistive coefficient (dr/R). Each spin valve sensor was then subjected to an annealing at 230° C. for 11 hours and the magnetoresistive coefficient (dr/R) was again measured which can be referred to as the final magnetoresistance coefficient (dr/R). The percent loss in magnetoresistive coefficient (dr/R) was then calculated for each spin valve sensor. After annealing the exchange coupling ($H_{EX}$) and pinning field ($H_P$) between the pinned and pinning layers were measured. The third, fourth and fifth examples, according to the present invention, showed an improvement in the magnetoresistive coefficient (dr/R) and less percentage loss between the initial and final magnetoresistive coefficients (dr/R) indicating an improvement in the exchange coupling ($H_{EX}$) and pinning field ($H_P$) between the pinning and pinned layers. Test data for each example is shown in the form of a flux density (B) versus applied field (H) loop, hereinafter referred to as a B/H loop, which provide information regarding the relationships between coercivity ($H_C$) of the pinned layer and the aforementioned exchange coupling fields ($H_{EX}$) and pinning field ($H_P$).

If a loop is symmetrical on both sides of the Y axis this indicates that there is virtually no exchange coupling field ($H_{EX}$) between the pinning and pinned layers and that the coercivity ($H_C$) of the pinning layer is controlling the loop. An applied field of approximately 1500 Oe was progressively applied in a direction opposite to the pinning direction and then relaxed to zero followed by applying 1500 Oe in the direction of the pinning direction and then relaxed to zero at room temperature. The duration of the applied field testing was approximately 12 minutes. If the B/H loop is more on one side of the Y axis than on the other side this indicates the presence of some exchange coupling ($H_{EX}$). The most favorable B/H loop is when the loop is located entirely on one side of the Y axis and there is no loop on the other side of the Y axis. This means that when the magnetic spins of the pinning layer are rotated 180° from the pinning direction and then relaxed that the magnetic spins return to the original pinning direction. It is highly important that the magnetic moment of the pinned layer return to the original pinning direction after it has also been rotated by the applied field for ensuring maximum exchange coupling field between the pinned and pinning layers. The test results for each of the examples is shown in Chart A at the end of this description.

Figure 12:
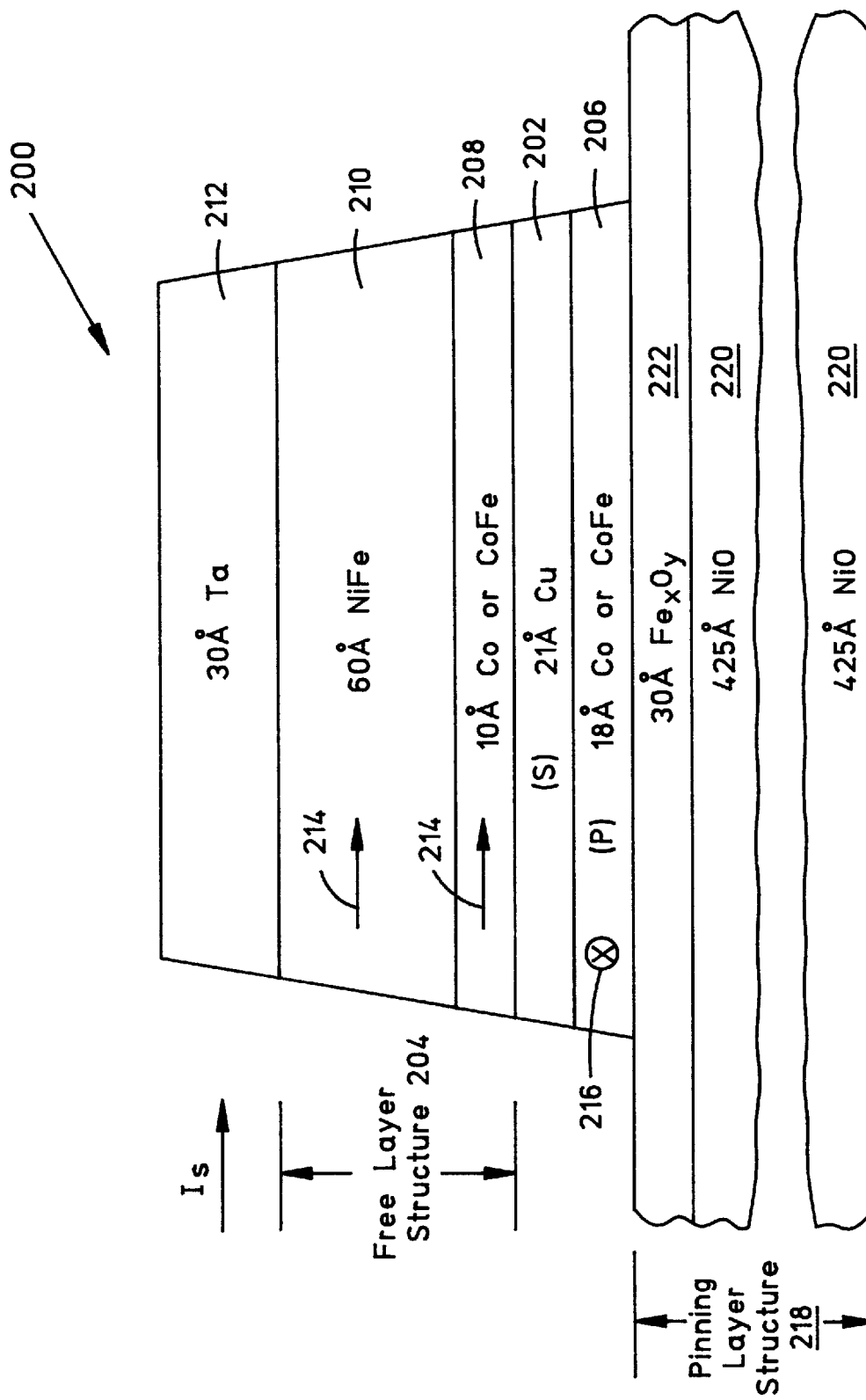
FIG. 12 is an air bearing surface (ABS) view of a preferred spin valve sensor according to the present invention.

In FIG. 12 there is shown a preferred embodiment of the present spin valve sensor 200. The spin valve sensor 200 includes a spacer layer (S) 202 which is located between a free layer structure 204 and a pinned layer structure 206. The pinned layer structure 206 may be a single pinned layer, as shown in FIG. 12, or an antiparallel (AP) pinned layer structure wherein an antiparallel coupling layer is located between first and second ferromagnetic antiparallel layers, as described in U.S. Pat. No. 5,710,223, which is incorporated by reference herein. The free layer structure may include a cobalt (Co) or cobalt iron (CoFe) first film 208 and a nickel iron (NiFe) second film 210 with the first film being located between the spacer layer 202 and the second film 210. A cap layer 212 may be located on the free layer structure 204 for its protection from subsequent processing steps. An exemplary orientation of the magnetic moment of the free layer structure 204 is from left to right parallel to the ABS, as shown at 214, and an exemplary orientation of the magnetic moment 216 of the pinned layer 206 is perpendicular to the ABS, either toward the ABS or away from the ABS, as shown in FIG. 12. A rotation of the magnetic moment 214 of the free layer structure 204 away from the ABS in response to a signal field will decrease the resistance of the sensor 200 and a rotation of the magnetic moment 214 toward the ABS in response to a signal field will increase the resistance of the sensor. A sense current Is is conducted through the sensor and the processing circuitry 50, shown in FIG. 3, detects potential changes as playback signals.

The pinned layer 206 interfaces and is exchange coupled to a pinning layer structure 218 wherein the pinning layer structure has magnetic spins oriented perpendicular to away from the ABS for pinning the magnetic moment 216 of the pinned layer, as shown in FIG. 12. The pinning layer structure 218 includes a nickel oxide (NiO) first film 220 and a second film 222 which is located between the first film 220 and the pinned layer 206. The second film is iron oxide ($Fe_xO_y$) which may be $Fe_2O_3$ or $Fe_3O_4$. The preferred thickness of the nickel oxide (NiO) first film 220 is 425 Å and the preferred thickness for the iron oxide second film 222 is 30 Å. The preferred range for the thickness of the iron oxide ($Fe_2O_3$) or ($Fe_3O_4$) film 222 is 20 Å to 50 Å. In a preferred embodiment of the invention the nickel oxide (NiO) first film 220 is reactively sputter deposited and the iron oxide ($Fe_2O_3$) or ($Fe_3O_4$) second film 222 is reactively sputter deposited, which will be explained in more detail hereinafter. Reactively sputter depositing means that sputtered nickel or iron is reactively combined with oxygen at a wafer substrate for forming films of nickel oxide (NiO) or iron oxide ($Fe_2O_3$) or ($Fe_3O_4$) respectively. Reactive sputter depositing is fully described in my commonly assigned U.S. Pat. No. 5,871,622 which is incorporated by reference herein. The microstructure of each of the reactively sputtered first and second films 220 and 222 is different from the micro structure of each of these films when they are not reactively sputtered and can be determined from analysis with a transmission electron microscope. When the first and second films 220 and 222 are reactively sputtered their texture is uniquely uniform as compared to the texture of these films when they are not reactively sputtered. The films are not reactively sputtered when the targets are nickel oxide (NiO) or iron oxide ($Fe_2O_3$) or ($Fe_3O_4$) in which case sputtered atoms of nickel oxide (NiO) or iron oxide ($Fe_2O_3$) or ($Fe_3O_4$) are sputtered from the target and deposited on the wafer substrate. A study, which includes five examples described hereinafter, shows a significant improvement in the magnetoresistive coefficient (dr/R) and the exchange coupling field ($H_{EX}$) between the pinned layer 206 and the pinning layer structure 218 when the present invention is employed.

Exemplary thicknesses and materials for the remainder of the layers of the spin valve sensor 200 in FIG. 12 are 18 Å of cobalt (Co) or cobalt iron (CoFe) for the pinned layer 206, 21 Å of copper (Cu) for the spacer layer 202, 10 Å of cobalt (Co) or cobalt iron (CoFe) for the first film 208 of the free layer structure, 60 Å of nickel iron (NiFe) for the second film 210 of the free layer structure and 50 Å of tantalum (Ta) for the cap layer 212.

Method of Making

Figure 13:
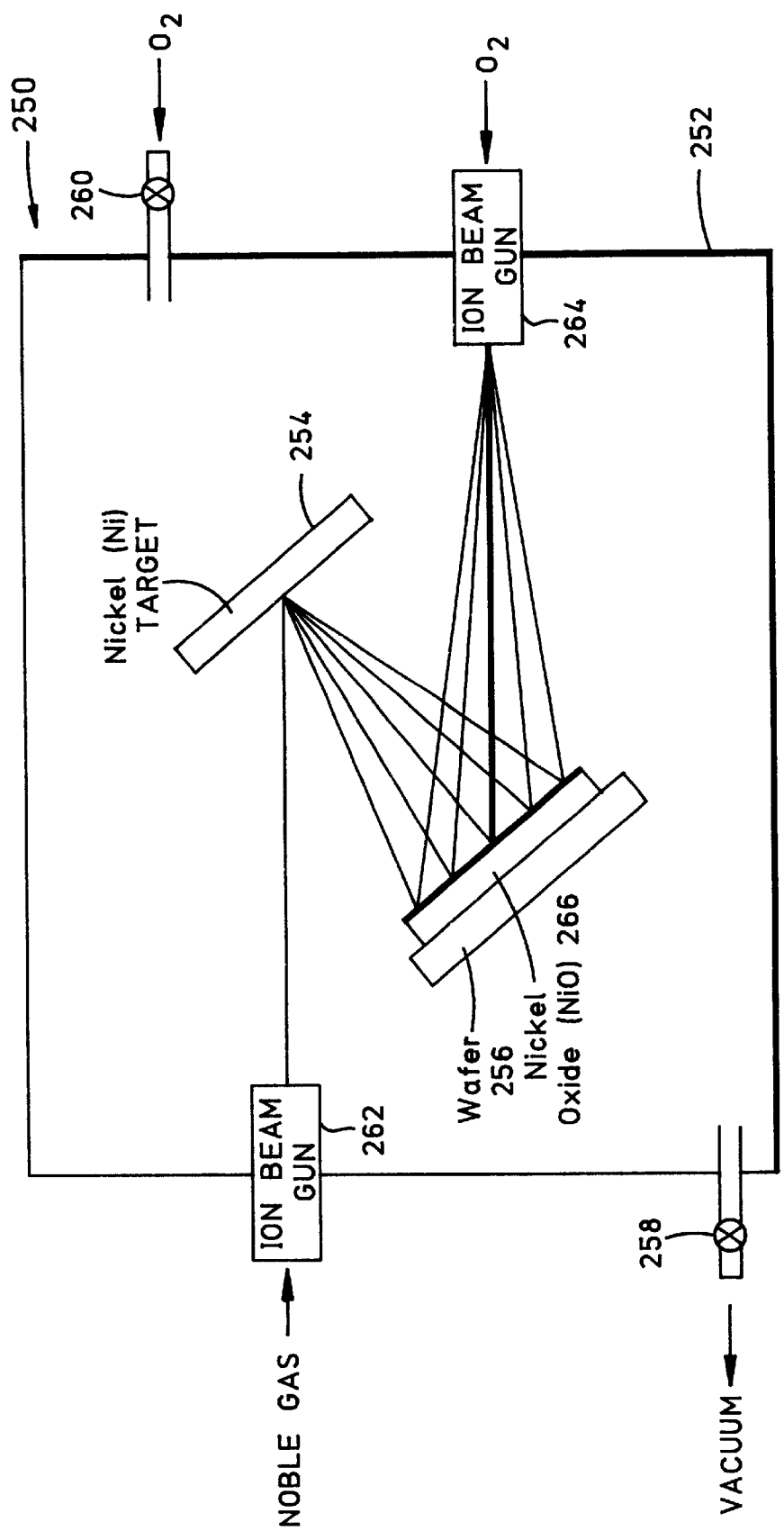
FIG. 13 is a schematic illustration of a sputtering chamber for reactively sputtering a first film of a pinning layer.

In FIG. 13 there is shown a sputtering chamber 250 which includes a chamber 252, a nickel (Ni) target 254, a wafer substrate 256 facing the target 254 in a spaced relationship, an outlet 258 to a pump (not shown) for drawing a vacuum on the chamber 252, an inlet 260 or an ion beam gun 264 for receiving a working gas, such as argon (Ar), and a reactive gas, such as oxygen ($O_2$) and a first ion beam gun 262 for receiving a noble gas, such as argon (Ar), krypton (Kr) or xenon (Xe), for ionizing the gas and accelerating the gas as an ion beam toward the target 254 for sputtering nickel (Ni) atoms from the target and thence onto the wafer substrate 256. The meeting of the nickel atoms and the oxygen at the wafer substrate 256 causes a reaction which forms a nickel oxide (NiO) first film 266 on the wafer substrate.

Figure 14:
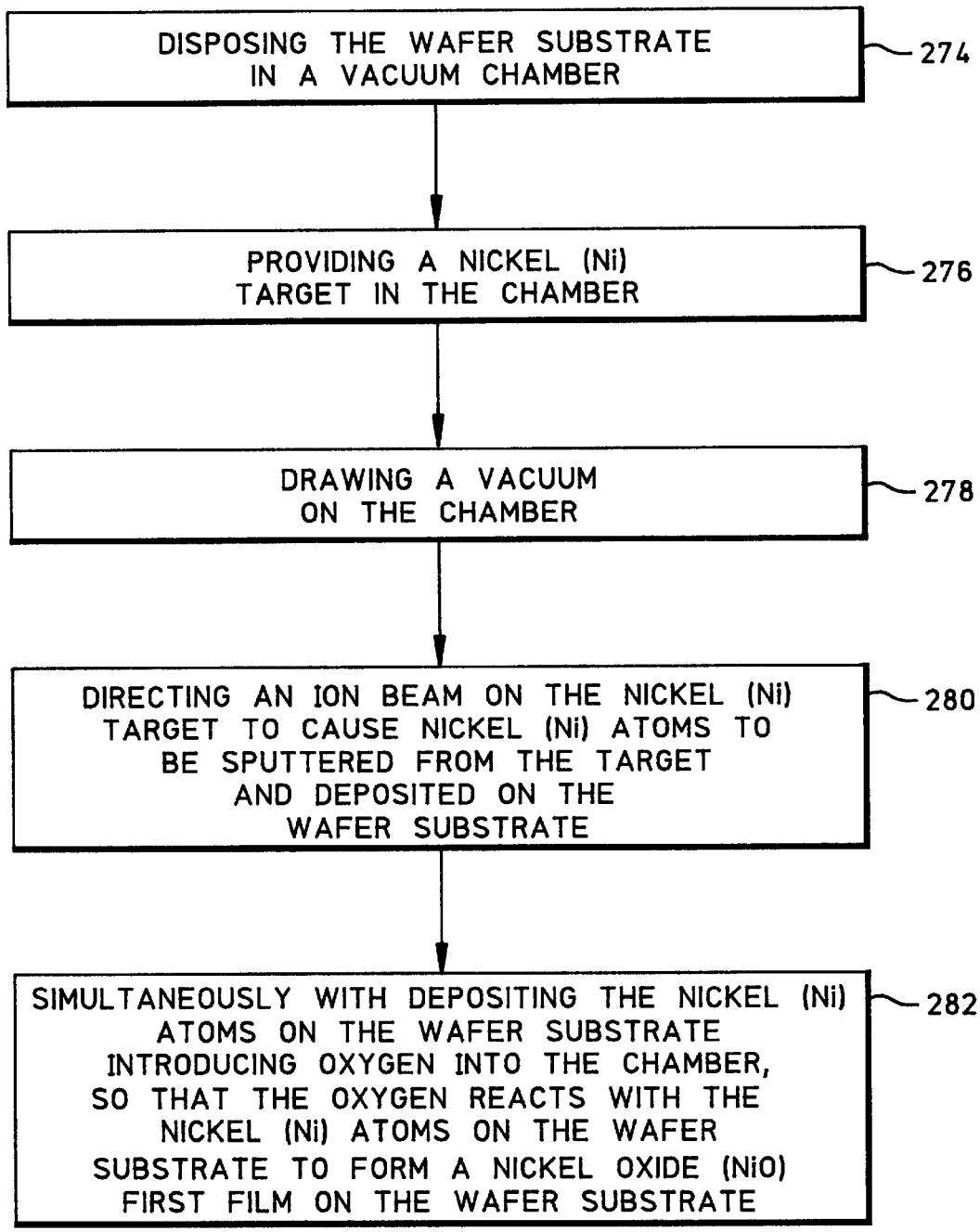
FIG. 14 is a block diagram showing steps of reactively sputter deposit the first film of the pinning layer.

Formation of the nickel oxide (NiO) first film 266 is fully described in block diagram form in FIG. 14 wherein in the first step 274 the wafer substrate 256 is disposed in the vacuum chamber 252, in block 276 the nickel (Ni) target 254 is provided in the chamber, in block 278 a vacuum is drawn on the chamber 202 via the outlet 258, in block 280 an ion beam is directed from the ion beam gun 262 onto the target 254 to cause nickel (Ni) atoms to be sputtered from the target 254 and deposited on the wafer substrate 256 and in block 282, simultaneously with depositing the nickel (Ni) atoms on the wafer substrate 256, oxygen is introduced into the chamber 252 so that the oxygen reacts with the nickel atoms on the wafer substrate 256 to form the nickel oxide first film 266.

Reactively Depositing Iron Oxide ($Fe_2O_3$) or ($Fe_3O_4$)

Figure 15:
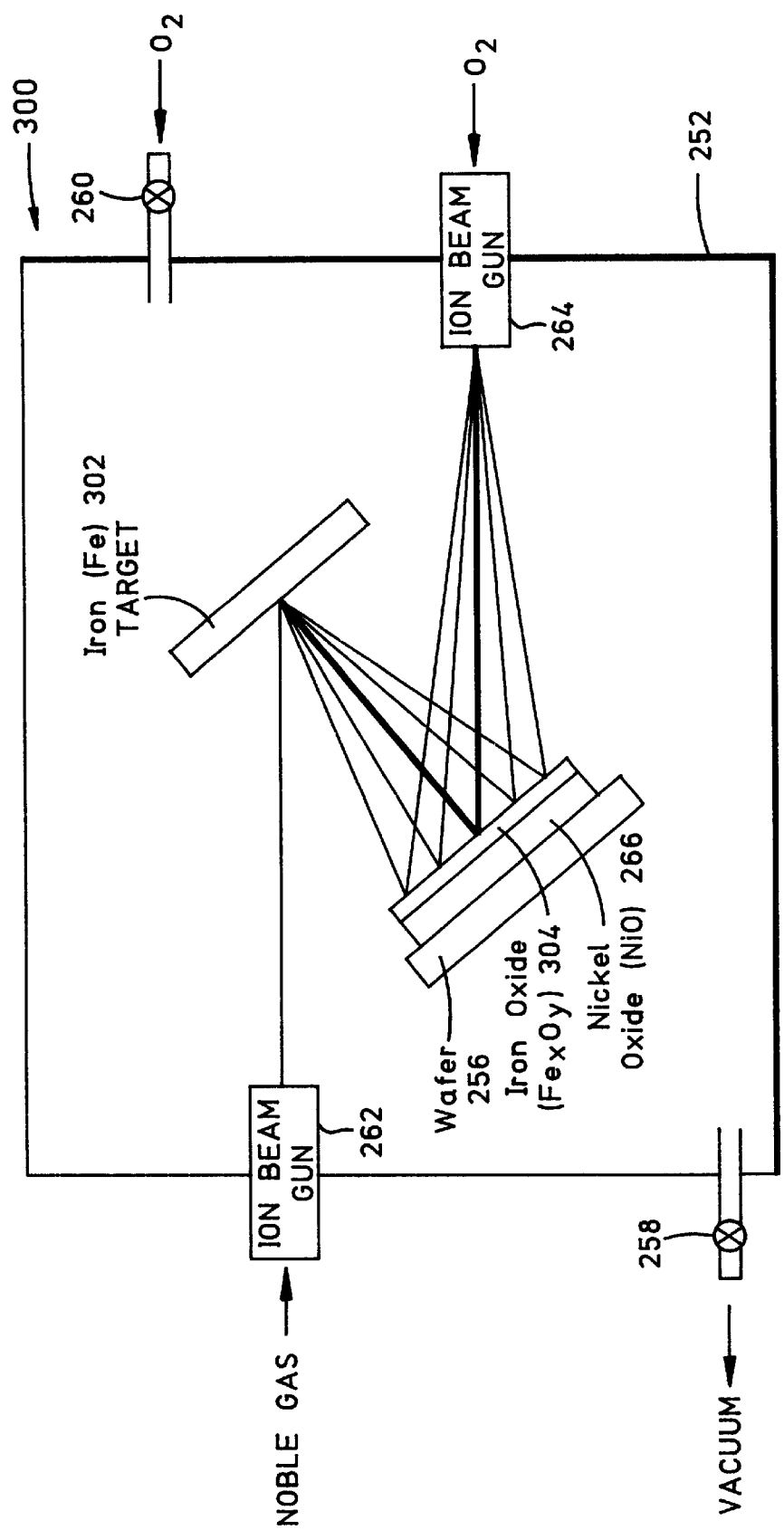
FIG. 15 is a schematic illustration of the sputtering chamber reactively depositing a second film of the pinning layer.

The sputtering chamber in FIG. 15 is the same as the sputtering chamber 250 in FIG. 13 except an iron (Fe) target 302 is employed and an iron oxide ($Fe_xO_y$) second film 304 is formed on the nickel oxide (NiO) first film 266.

Figure 16:
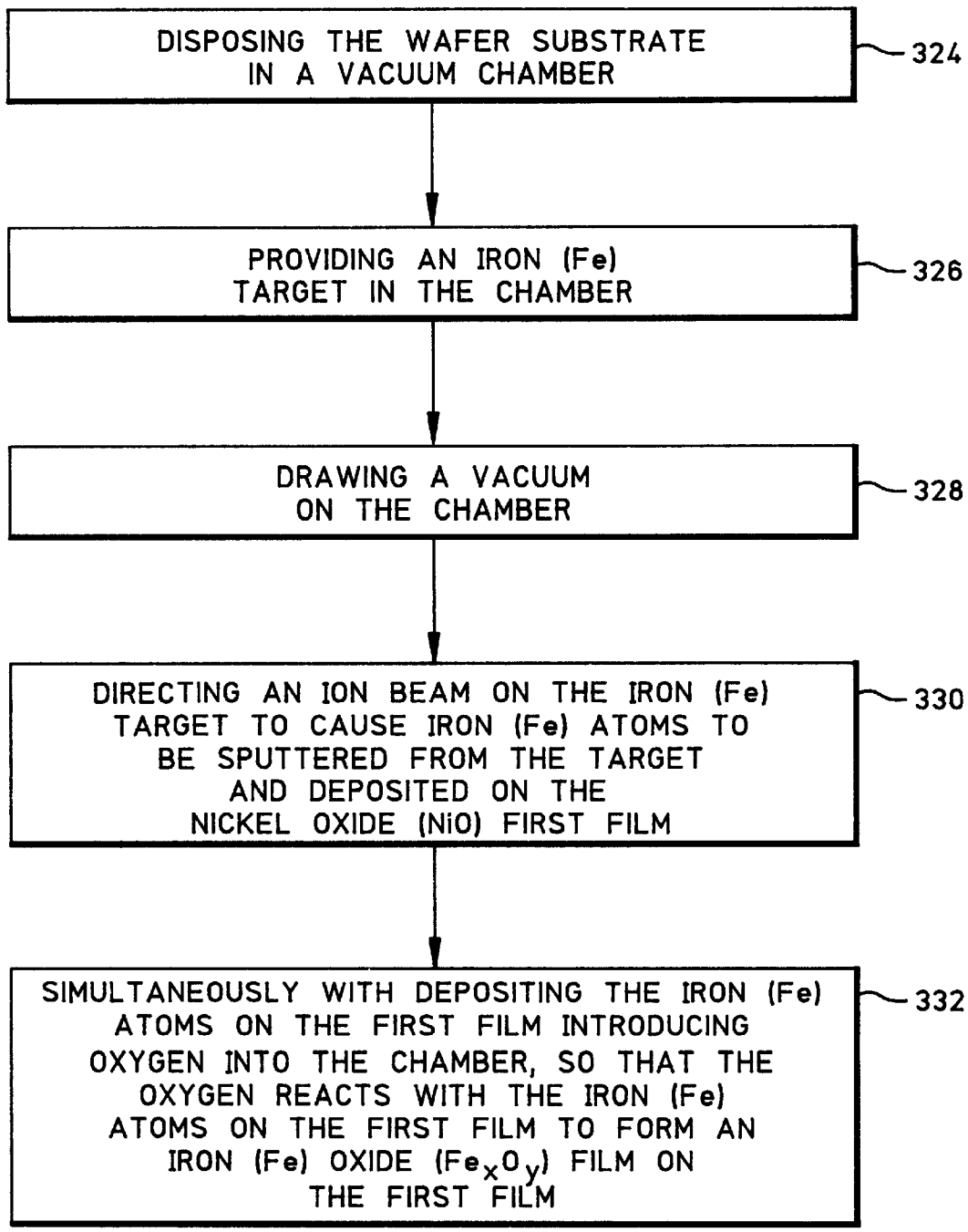
FIG. 16 is a block diagram showing the steps in reactively depositing the second film of the pinning layer.

The process for reactively sputter depositing the iron oxide ($Fe_2O_3$) or ($Fe_3O_4$) 304 in FIG. 15 is shown in block diagram in FIG. 16 wherein in the first block 324 a vacuum is drawn on the chamber 252, in the second block 326 the iron (Fe) target 302 is provided in the chamber, in block 328 a vacuum is drawn on the chamber, in block 330 an ion beam is directed from the ion beam gun 262 on the iron (Fe) target 302 causing iron (Fe) atoms to be sputtered from the target and deposited on the nickel oxide (NiO) first film 266, in block 332 and simultaneously with depositing the iron (Fe) atoms on the first film 266, oxygen is introduced into the chamber by the inlet 260 or the ion beam gun 264 so that the oxygen reacts with the iron (Fe) atoms on the first film 266 to form an iron oxide ($Fe_2O_3$) or ($Fe_3O_4$) second film 304 on the first film 266.

Forming the Pinned Layer

Figure 17:
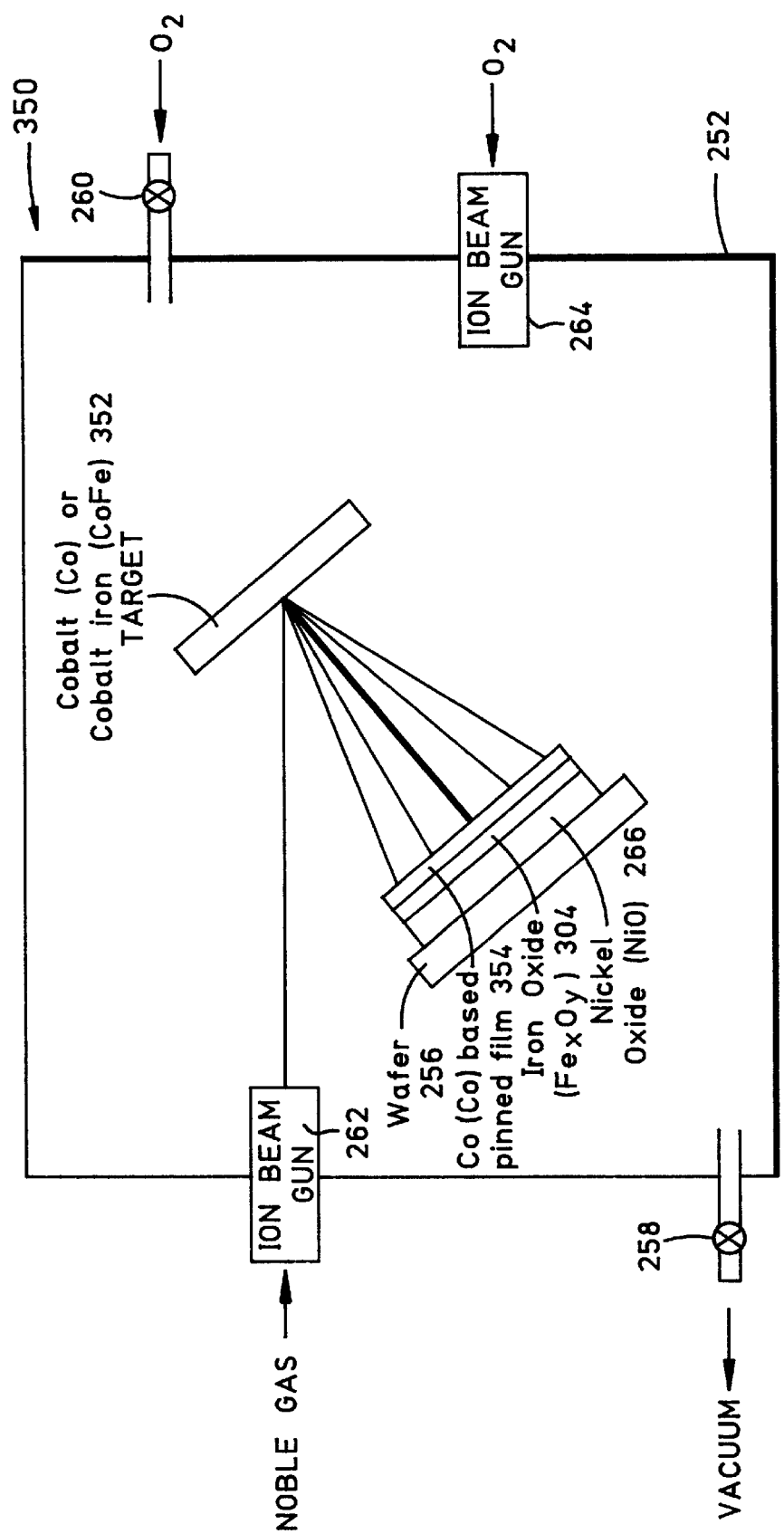
FIG. 17 is a schematic illustration of the sputtering chamber sputter depositing a pinned layer on the second film of the pinning layer.

In FIG. 17 there is shown a sputtering chamber 350 which is the same as the sputtering chamber 300 in FIG. 15 except a cobalt (Co) or cobalt iron (CoFe) target 352 is employed and a cobalt (Co) or cobalt iron (CoFe) pinned film 354 is formed on the iron oxide ($Fe_2O_3$) or ($Fe_3O_4$) second film 304 and is exchange coupled thereto.

Figure 18:
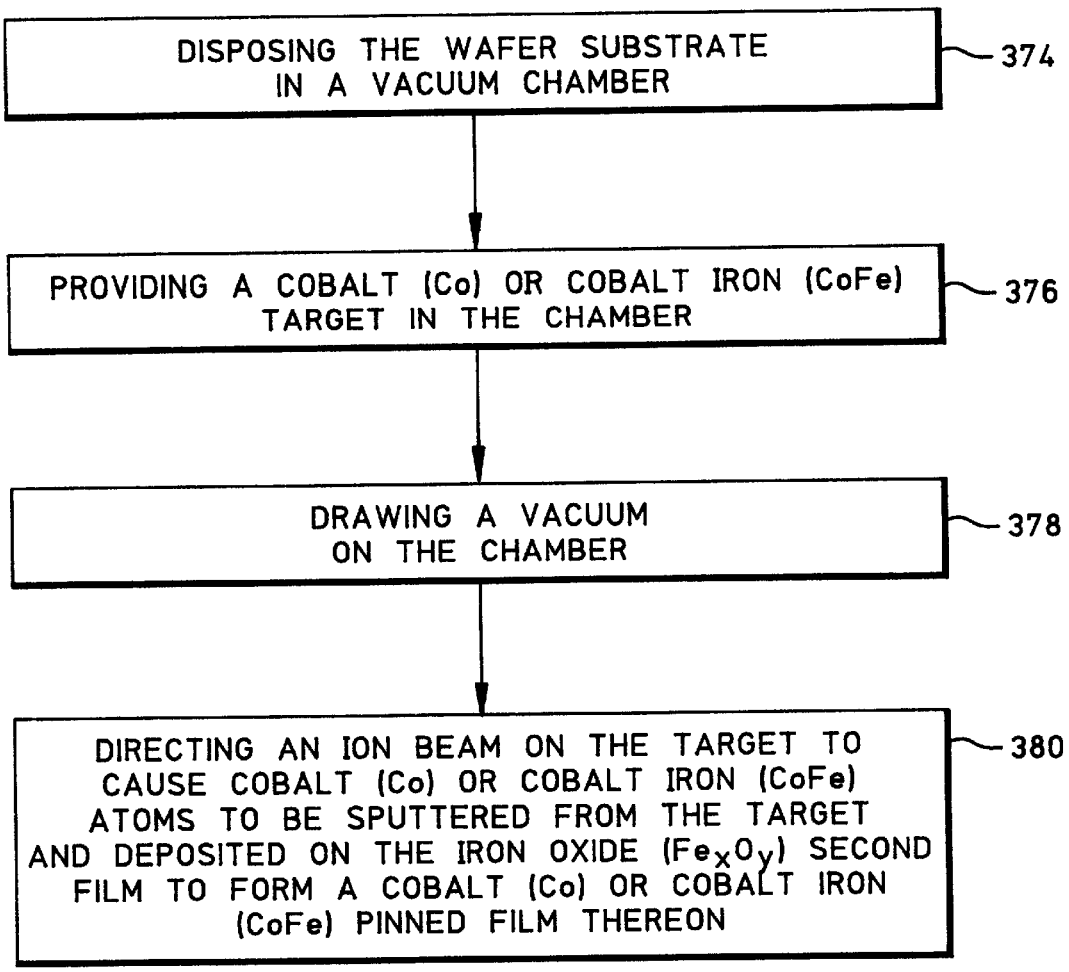
FIG. 18 is a block diagram of the steps involved in sputter depositing the pinned layer.

The process for forming the cobalt (Co) or cobalt iron (CoFe) pinned film 354 is shown in block diagram in FIG. 18 wherein in the first block 374 the wafer substrate 256 with the first and second films 266 and 304 are disposed in the vacuum chamber 252, in the block 376 a cobalt (Co) or cobalt iron (CoFe) target 352 is provided in the chamber, in the block 378 a vacuum is drawn on the chamber, and in block 380 an ion beam is directed from the ion beam gun 262 onto the target 352 to cause cobalt (Co) or cobalt iron (CoFe) atoms to be sputtered from the target and deposited on the iron oxide ($Fe_2O_3$) or ($Fe_3O_4$) second film 304 to form a cobalt (Co) or cobalt iron (CoFe) pinned film 354 thereon.

Alternate Reactive Sputter Depositing

Figure 19:
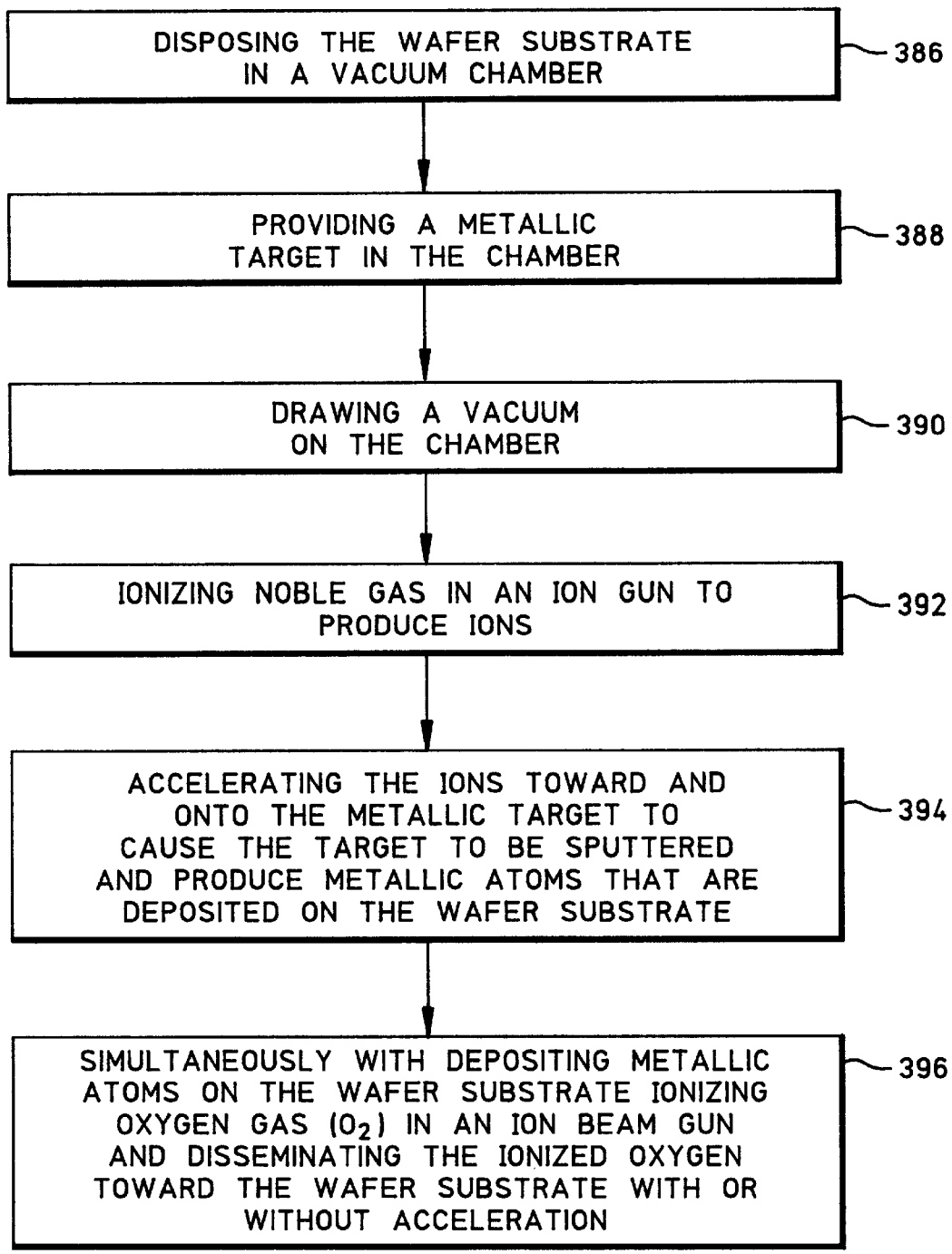
FIG. 19 is an alternate method of reactively depositing the first or second films of the pinning layer.

FIG. 19 is a process illustrated in block diagram form which is an alternate process for the processes shown in block diagram form in FIGS. 14 and 16. In block 386 the wafer substrate is disposed in the vacuum chamber, in block 388 the metallic target is provided in the chamber, in block 390 a vacuum is drawn on the chamber, in block 392 the noble gas is ionized in an ion gun to produce ionized noble gas in the chamber, in block 394 the ionized noble gas is accelerated toward and onto the target to cause the target to be sputtered and produce metallic atoms that are deposited on the wafer substrate and in block 306 and simultaneously with depositing metallic atoms on the wafer substrate, oxygen gas ($O_2$) is ionized in the ion beam gun 264 and the ionized oxygen is disseminated from the ion gun toward the wafer substrate 256 with or without acceleration by the ion beam gun. Disseminating without acceleration is preferred for promoting an improved deposition.

Example 1

Figure 20:
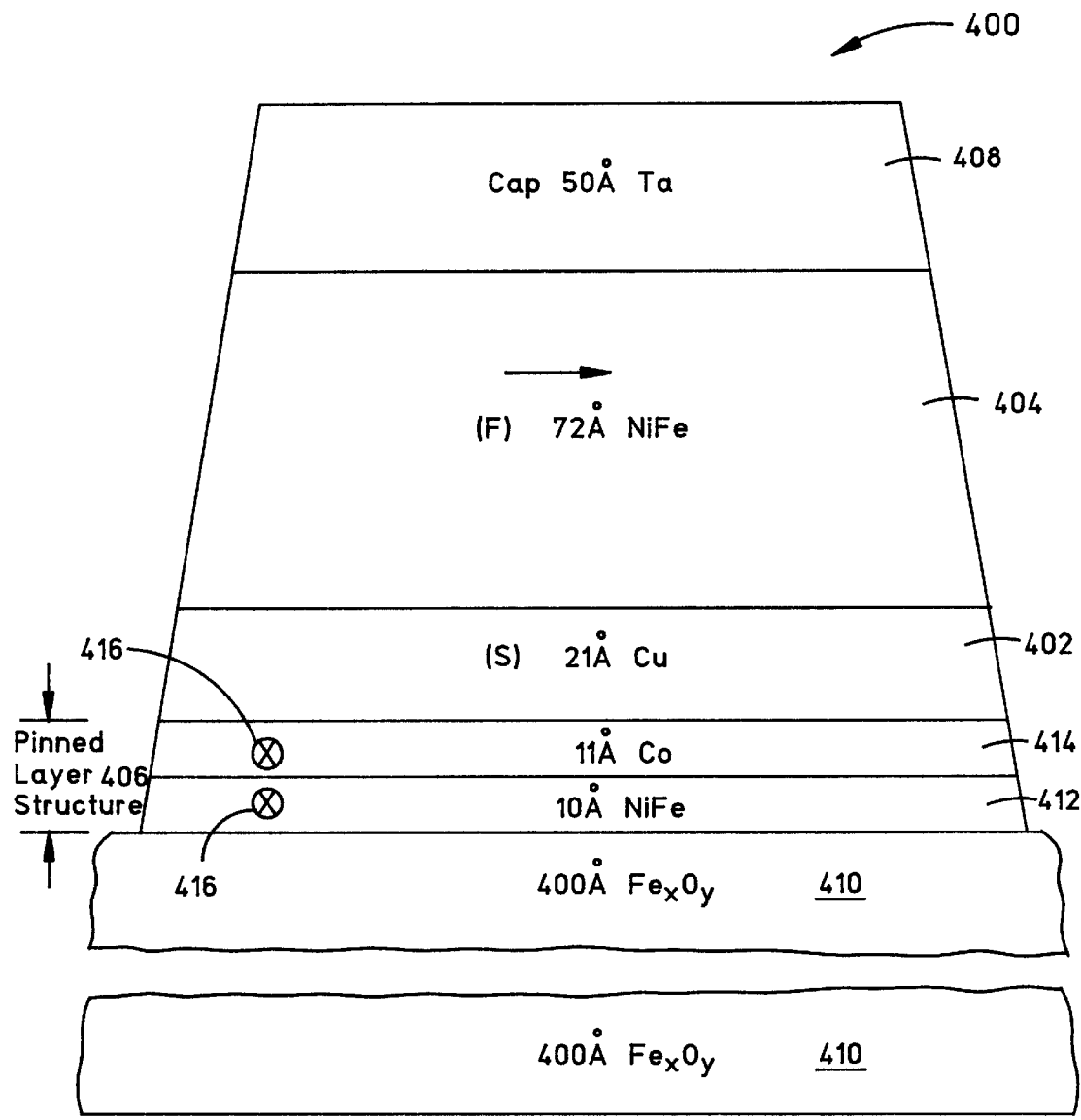
FIG. 20 is an ABS illustration of a first example of a spin valve sensor.
Figure 21:
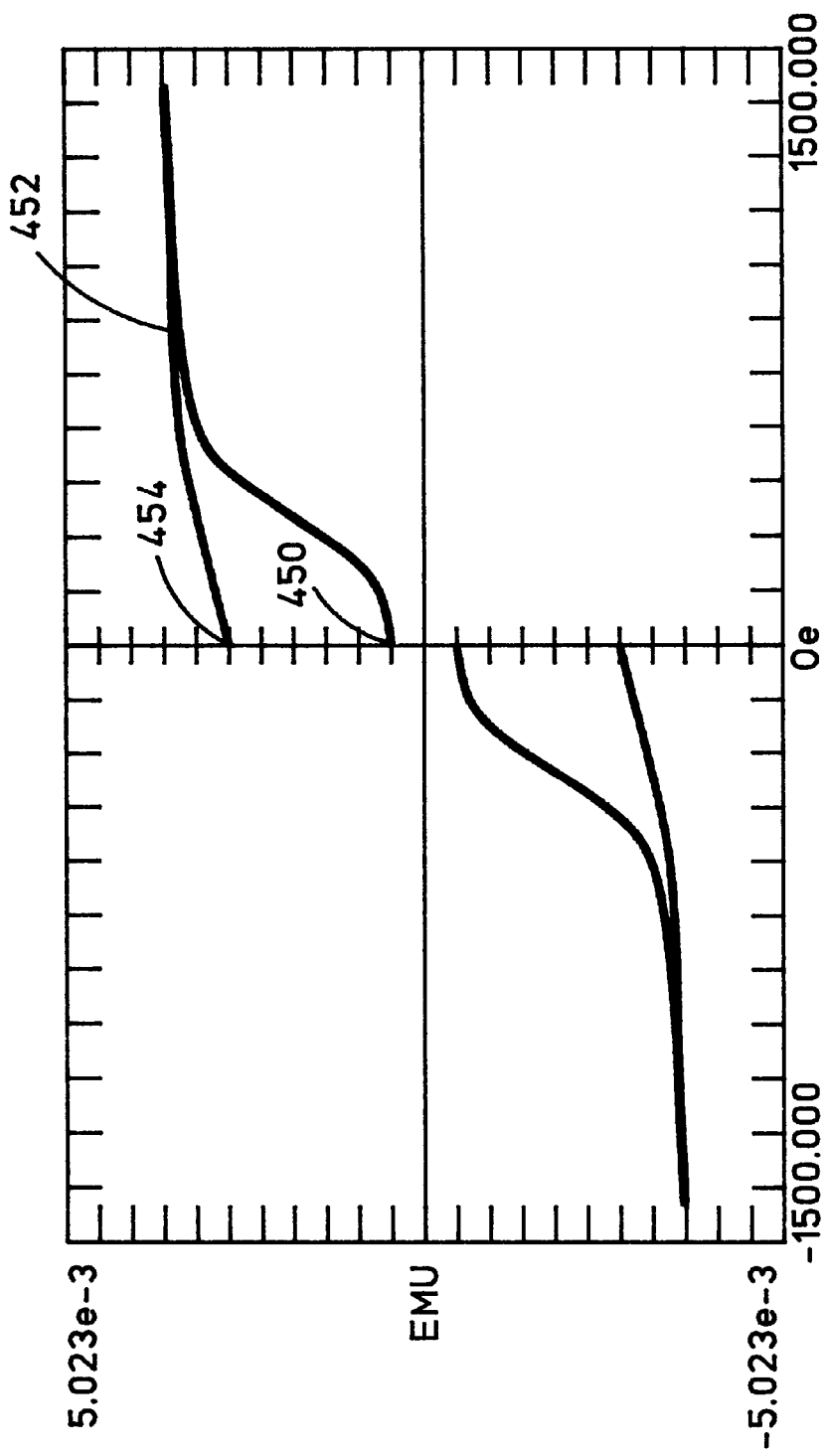
FIG. 21 is a B/H graph showing the test results of the spin valve sensor shown in FIG. 20.

In FIG. 20 a first example 400 of a spin valve sensor is illustrated which includes a 21 Å copper (Cu) spacer layer (S) 402 which is located between a 72 Å nickel iron (NiFe) free layer (F) 404 and a pinned layer structure 406. A 50 Å tantalum (Ta) cap layer 408 is located on the free layer 404 for its protection from subsequent processing steps. The pinned layer structure 406 is exchange coupled to an antiferromagnetic (AFM) pinning layer 410 which is 400 Å of iron oxide ($Fe_2O_3$) or ($Fe_3O_4$). The pinned layer structure 406 included a 10 Å nickel iron (NiFe) first film 412 and a 11 Å cobalt (Co) second film 414 with the first film 412 being located between the pinning layer 410 and the second film 414. The pinning layer 410 is for the purpose of pinning a magnetic moment 416 of the pinned layer structure perpendicular to the ABS. The pinning layer 410 was reactively sputter deposited from an iron (Fe) target. The B/H loop in FIG. 21 is symmetrical on both sides of the Y axis which indicates there was no substantial exchange coupling between the pinned layer structure 406 and the pinning layer 410. Accordingly, the coercivity ($H_C$) of the pinned layer structure 406 controls the shape of the loop. The coercivity ($H_C$) is the distance on the Y axis between the top and bottom points of either of the portions of the loop which is approximately 2.25 $10^{-3}$ EMU. The coercivity ($H_C$) of the pinned layer structure is approximately 375 Oe. As can be seen from the graph in FIG. 21, when the field is first applied at point 450 the pinned layer structure 406 in FIG. 20 commences to saturate and is frilly saturated at approximately point 452. When the field is completely relaxed the flux density within the pinned layer structure 406 returns to point 454 which is significantly displaced from point 450. Had the exchange coupling been sufficient between the pinned layer structure 406 and the pinning layer 410 the loop would have returned to point 450 indicating that the magnetic moment 416 of the pinned layer structure had returned to its original orientation. The shape of the loop portion in the lower left quadrant is essentially the same shape as the loop portion in the upper right quadrant which indicates that there is no exchange coupling field. The initial magnetoresistive coefficient (dr/R) in this example was close to zero.

Example 2

Figure 22:
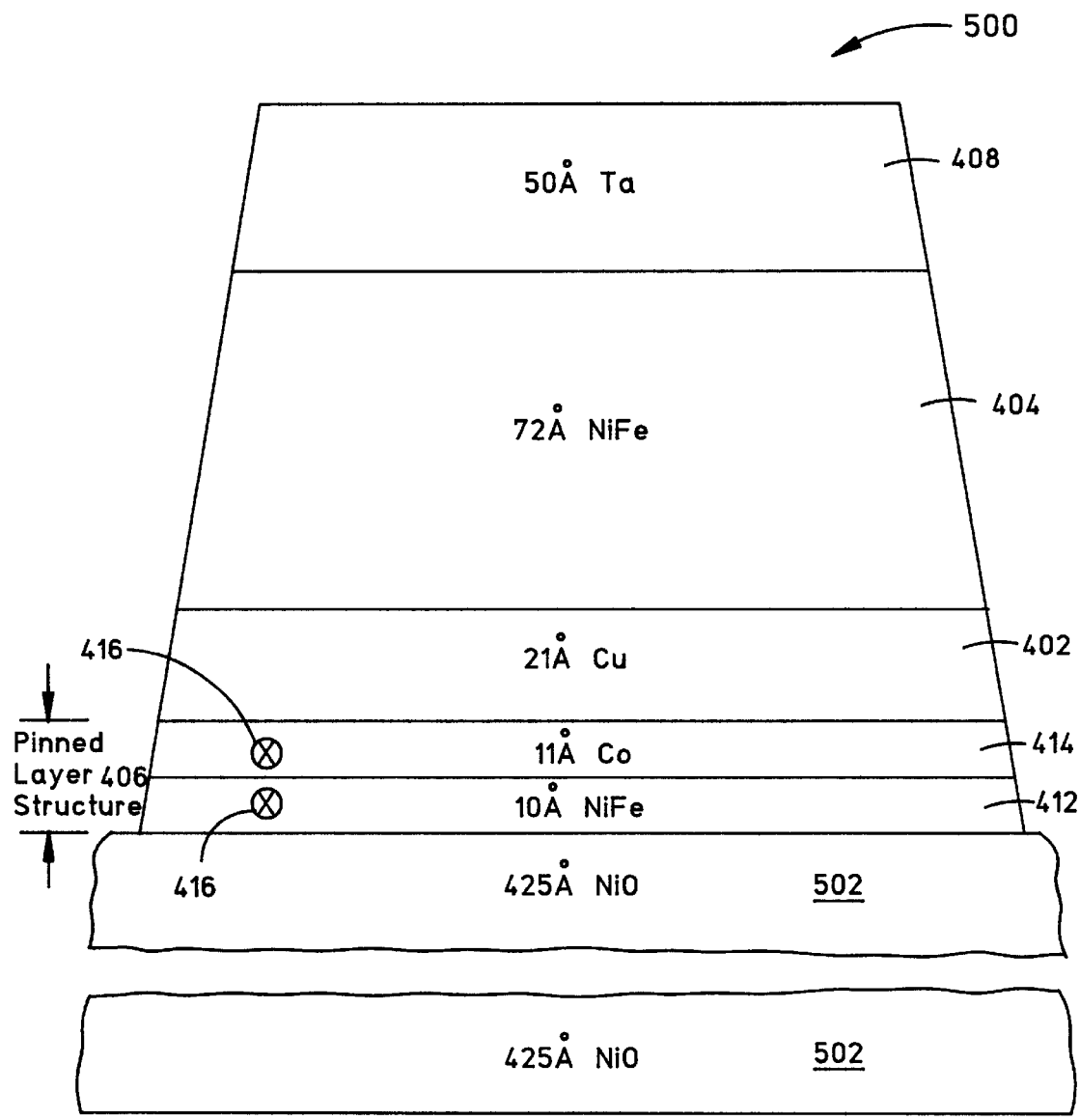
FIG. 22 is an ABS illustration of a second example of a spin valve sensor.
Figure 23:
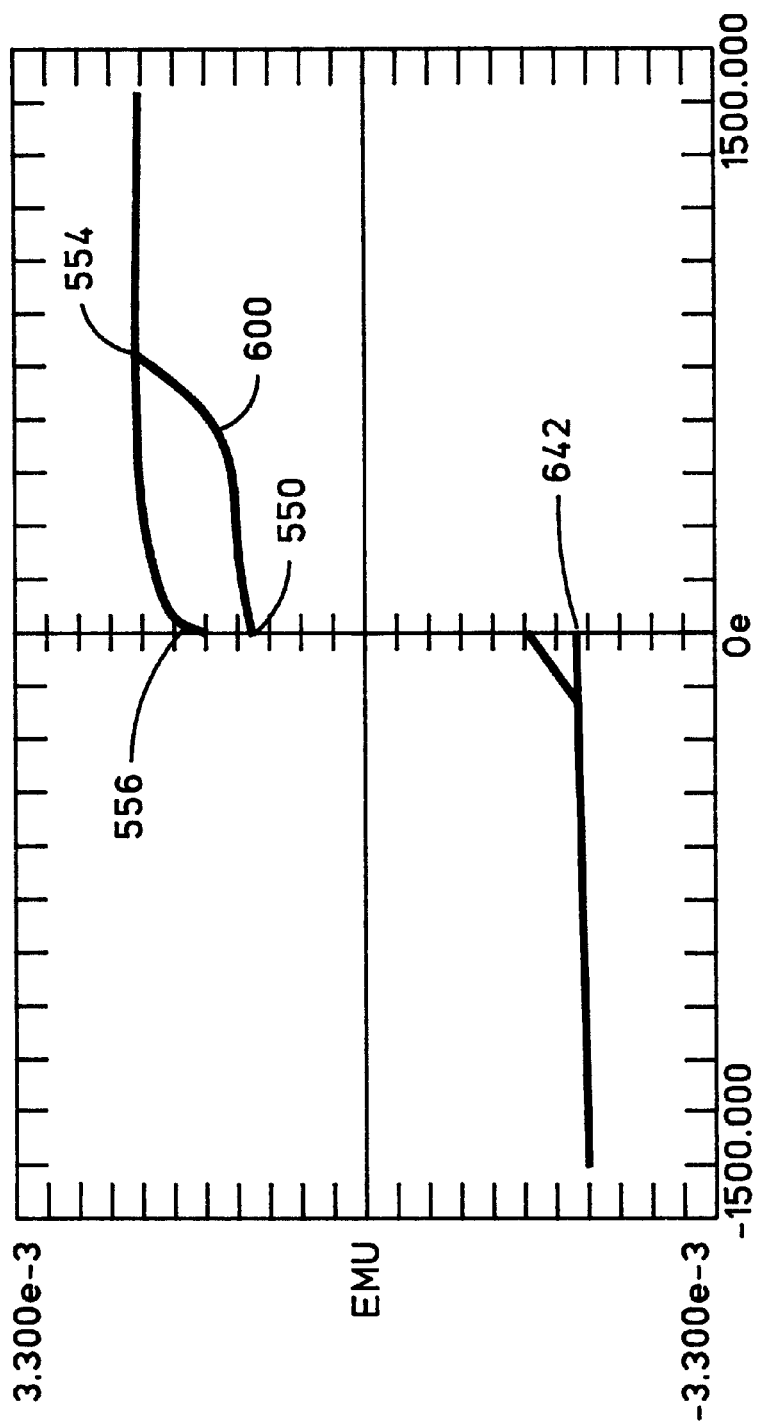
FIG. 23 is a B/H graph showing the test results of the spin valve sensor shown in FIG. 22.

FIG. 22 shows a second example of a spin valve sensor 500 which is the same as the spin valve sensor 400 in FIG. 20 except the pinning layer 502 is 425 Å of nickel oxide (NiO). The pinning layer 502 was reactively ion beam sputtered. The results are shown in the B/H loop in FIG. 23. The field was applied at 550 and progressively increased. At about 600 Oe the magnetic moment 416 of the pinned layer structure 406 commenced to rotate which means that its exchange coupling field with the pinning layer 502 was broken and, as the field was further increased the magnetic moment 416 continued to rotate until the pinned layer structure saturated at point 554 at which time the magnetic moment is antiparallel to its original orientation. As the applied field was relaxed to zero the magnetic moment returned part way and stopped at point 556. In order for the magnetic moment of the pinned layer structure to return to its original orientation the loop should have returned to point 550 instead of point 556. This, along with the fact that a small portion of the loop exists on the left side of the Y axis, indicates that the exchange coupling field was not fully sufficient to return the magnetic moment of the pinned layer structure to its original orientation. The exchange coupling field ($H_{EX}$) in this example was 225 Oe, the pinning field ($H_P$) was 550 Oe and the coercivity ($H_C$) of the pinned layer structure was 350 Oe. The initial magnetoresistive coefficient (dr/R) was 5.28% and the final magnetoresistive coefficient (dr/R) was 4.5%.

Example 3

First Embodiment of the Invention

Figure 24:
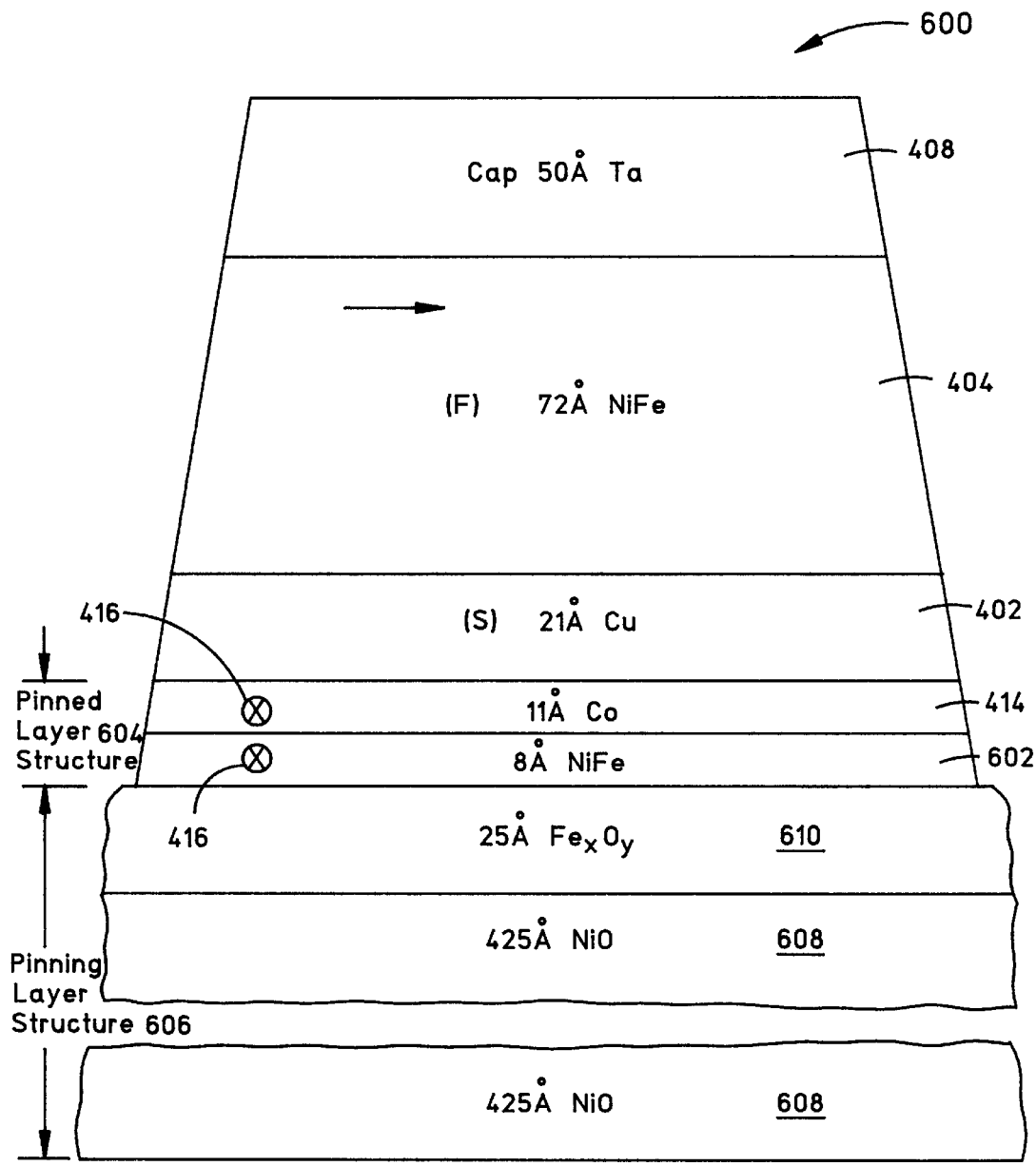
FIG. 24 is an ABS illustration of a third example of a spin valve sensor according to the present invention.
Figure 25:
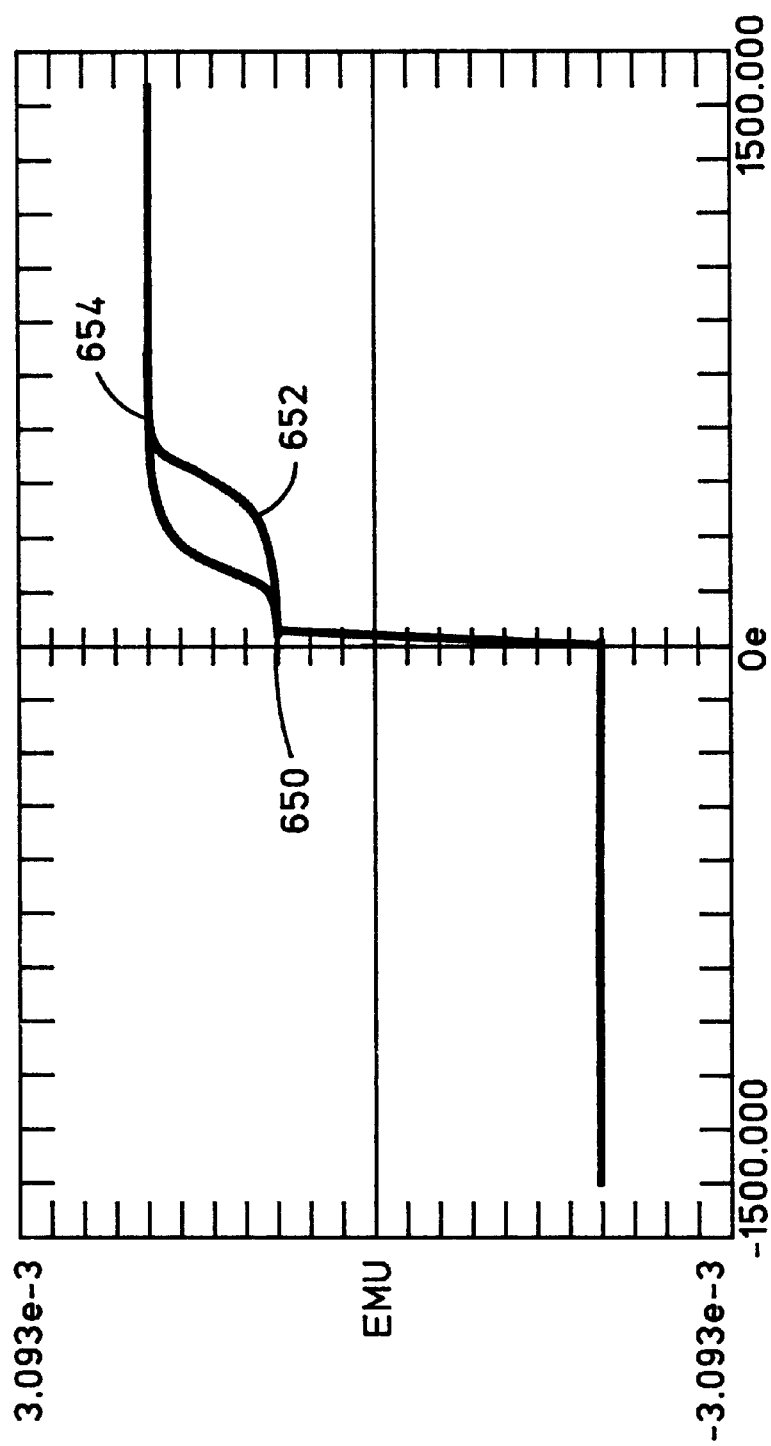
FIG. 25 is a B/H graph showing the test results of the spin valve sensor shown in FIG. 24.

In Example 3 in FIG. 24 the spin valve sensor 600 is the same as the spin valve sensor 500 in FIG. 22 except the first film 602 of the pinned layer structure 604 is 8 Å of nickel iron (NiFe), and a pinning layer structure 606 is provided which is exchange coupled to the pinned layer structure 604. The pinning layer structure 606 includes a 425 Å nickel oxide (NiO) first film which was reactively ion beam sputter deposited, as shown in FIGS. 13 and 14, and a 25 Å iron oxide ($Fe_2O_3$) or ($Fe_3O_4$) second film 610 which was reactively ion beam sputter deposited as shown in FIGS. 15 and 16. As can be seen from the B/H loop in FIG. 25 the loop is located entirely on one side of the Y axis. When the field is applied at 650 and progressively increased the magnetic moment 416 of the pinned layer structure commences to rotate at point 652 which is about 375 Oe, and is fully rotated antiparallel to its original orientation at about point 654 where the pinned layer structure 604 is saturated. When the applied field is fully relaxed the magnetic moment 416 returns to its original orientation, as shown by the return of the loop to the point 650. In this example, the exchange coupling field ($H_{EX}$) was 325 Oe, the pinning field ($H_P$) was 375 Oe and the coercivity ($H_C$) of the pinned layer structure was 100 Oe. The initial magnetoresistive coefficient (dr/R) was 5.07% and the final magnetoresistive coefficient (dr/R) was 4.72% which is a loss of 7% from the initial magnetoresistive coefficient (dr/R).

Example 4

Second Embodiment of the Invention

Figure 26:
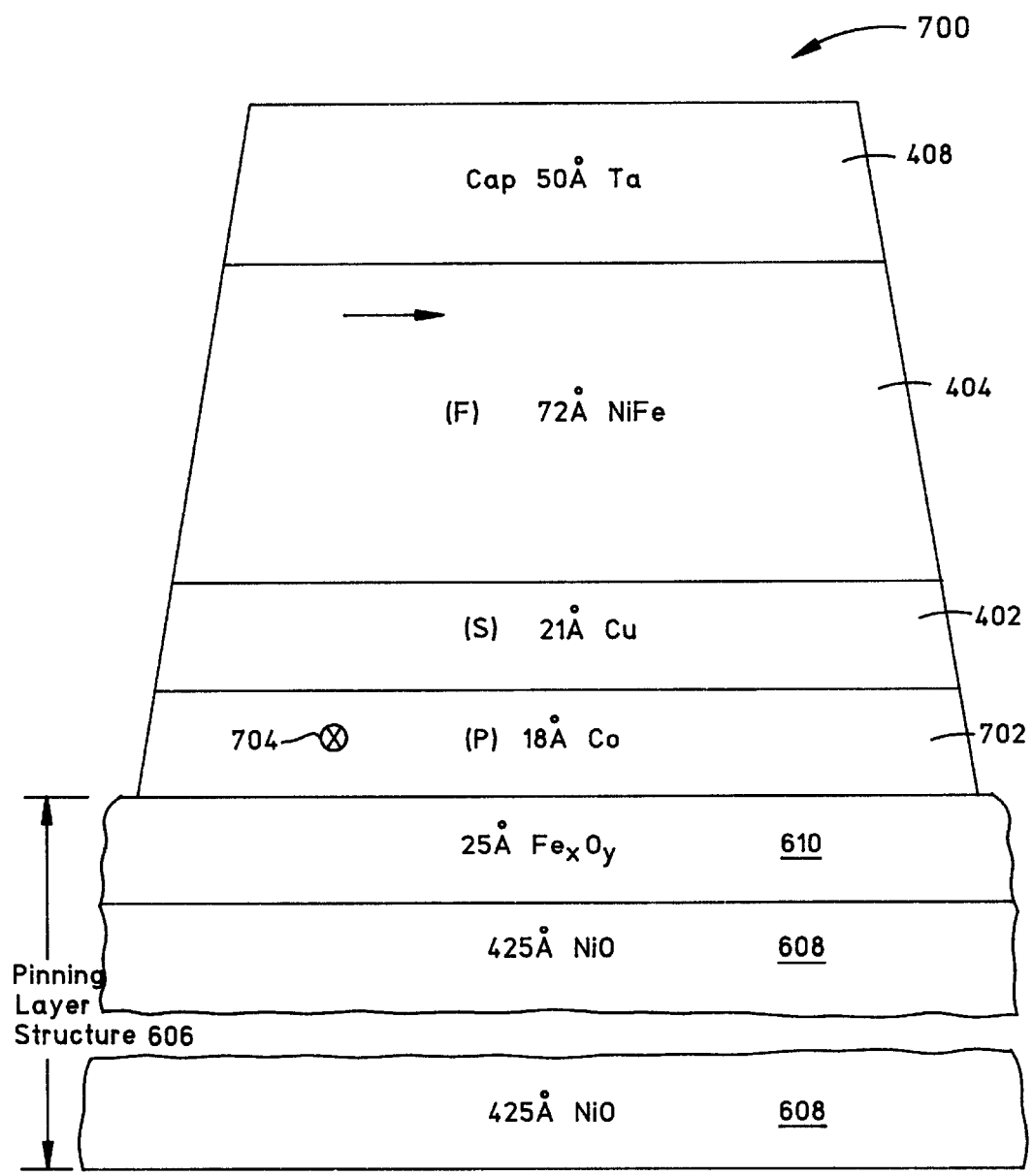
FIG. 26 is an ABS illustration of a fourth example of a spin valve sensor according to the present invention.
Figure 27:
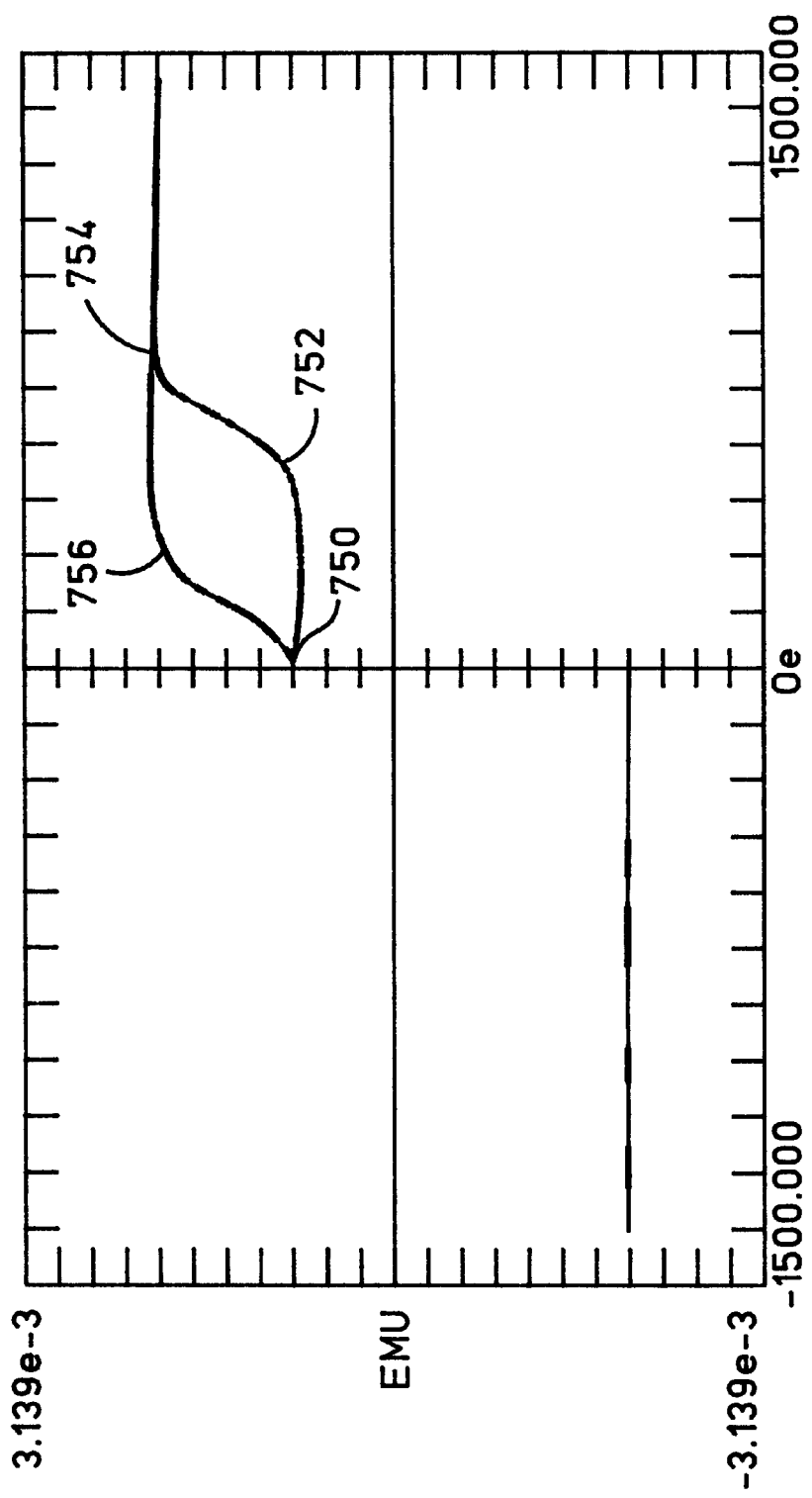
FIG. 27 is a B/H graph showing the test results of the spin valve sensor shown in FIG. 26.

FIG. 26 illustrates a fourth example of a spin valve sensor 700 which is the same as the spin valve sensor 600 in FIG. 24 except the pinned layer structure 604 in the sensor 600 has been replaced by an 18 Å cobalt (Co) single pinned layer 702 which interfaces and is exchange coupled to the pinning layer structure 606. The pinning layer structure 606 is the same as the pinning layer structure 606 in FIG. 24. As shown in FIG. 27, the B/H loop commences at a point 750, a magnetic moment 704 commences to rotate at about point 752 and is fully rotated antiparallel to its original position at about 754. Upon relaxing the applied field the magnetic moment stays antiparallel to about point 756 whereupon, after relaxing the applied field, the magnetic moment returns to its original orientation at point 750. The B/H loop is located entirely on one side of the Y axis and is well formed which indicates that the exchange coupling field between the pinning layer structure 606 and the pinned layer 702 completely returned the magnetic moment 704 of the pinned layer to its original orientation. The exchange coupling field ($H_{EX}$) in this example was 375 Oe and the pinning field ($H_P$) was 550 Oe. The initial magnetoresistive coefficient (dr/R) was 5.58% and the final magnetoresistive coefficient (dr/R) was 5.40% which was a 3.2% loss in the magnetoresistive coefficient (dr/R) after annealing.

Example 5

Third Embodiment of the Invention

Figure 28:
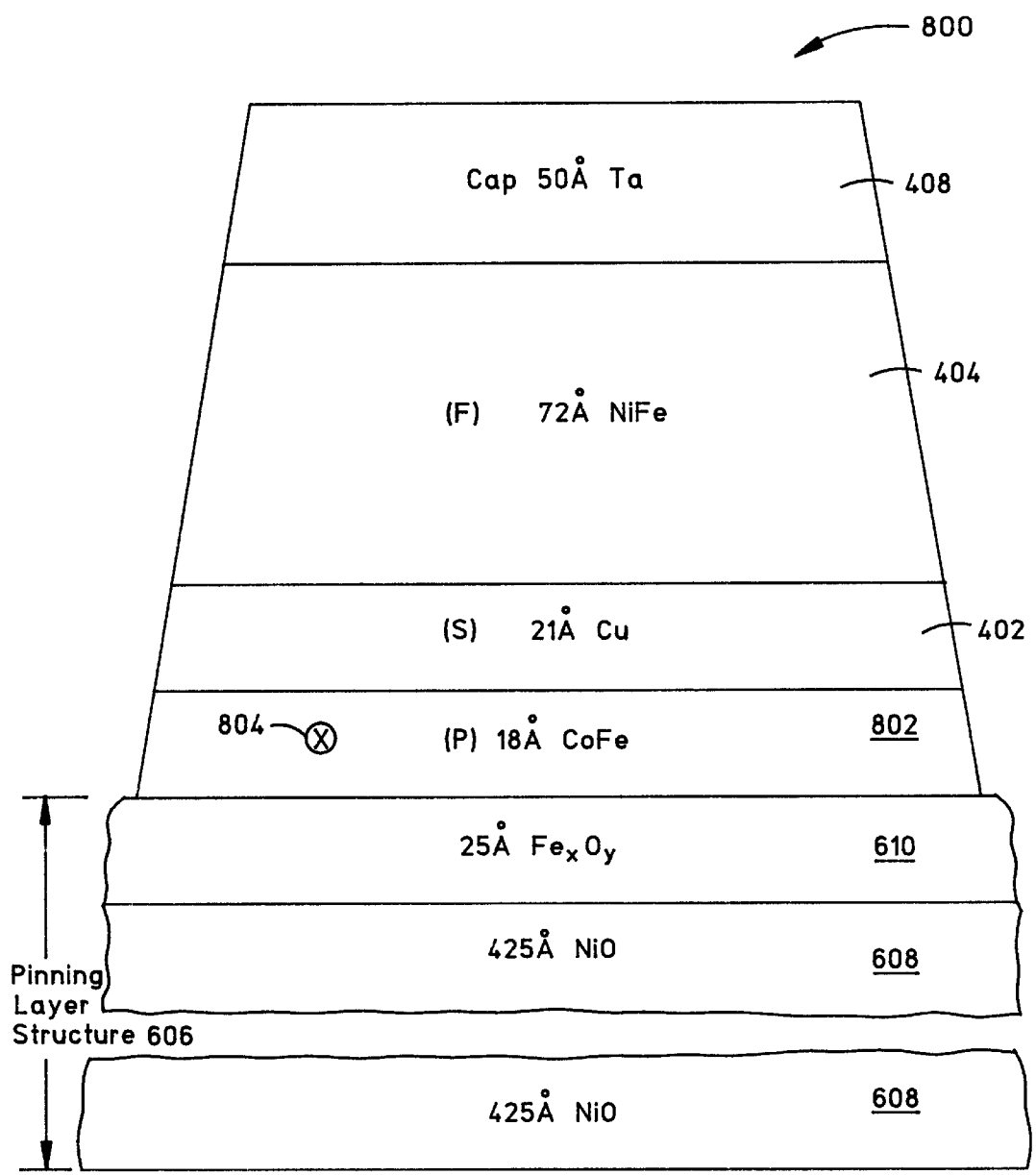
FIG. 28 is an ABS illustration of a fifth example of a spin valve sensor according to the present invention.
Figure 29:
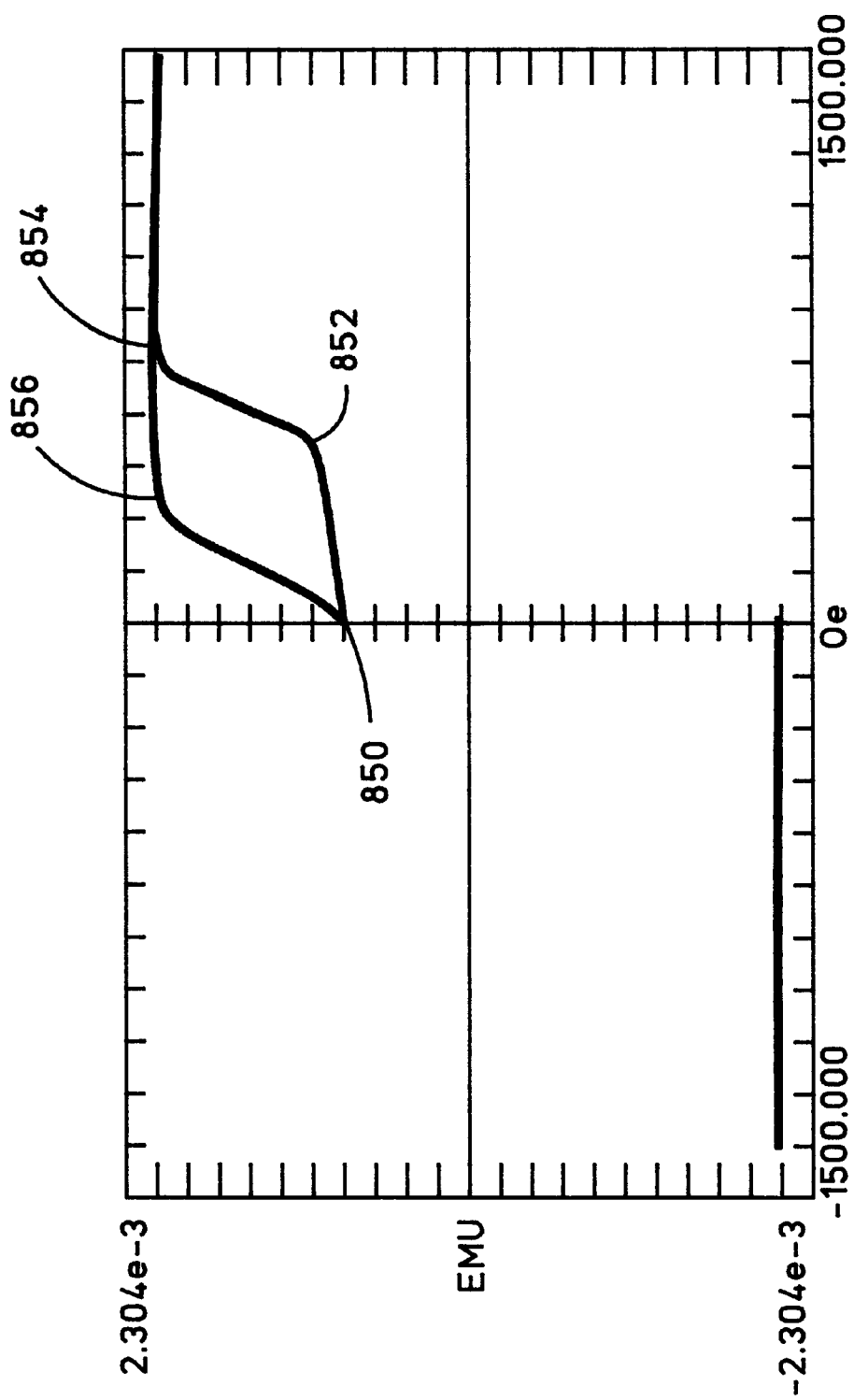
FIG. 29 is a B/H graph showing the test results of the spin valve sensor shown in FIG. 28.

In Example 5 in FIG. 28 the spin valve sensor 800 is the same as the spin valve sensor 700 in FIG. 26 except the pinned layer 802 is 18 Å of cobalt iron (CoFe). The pinning layer structure 606 is the same as the pinning layer structure 606 in FIG. 26. The B/H loop in FIG. 29 shows after the application of an applied field at point 850 a magnetic moment 804 commences to rotate at point 852 and is fully rotated antiparallel to its original position at point 854 where the pinned layer structure is fully saturated. Upon relaxing the applied field the magnetic moment stayed substantially antiparallel until point 856 after which, upon relaxation of the field, it returned to the original point 850 which indicates that the exchange coupled field has returned the magnetic moment of the pinned layer structure to its original orientation. The exchange coupling field ($H_{EX}$) was 375 Oe and the pinning field ($H_P$) was 500 Oe after annealing. The initial magnetoresistive coefficient (dr/R) was 5.54% and the final magnetoresistive coefficient (dr/R) was 5.42% which indicated a 2.1% loss in magnetoresistive coefficient (dr/R) after annealing.

CHART A

| Example | Exchange Type | Initial dR/R | dR/R 230 C Ann | % loss in dR/R | Hex after ann (Oe.) | Hp (Oe) after ann. | Hc |
|---|---|---|---|---|---|---|---|
| 1 | $Fe_xO_y$/NiFe/Co | 0 | 0 | 0 | 0 | 0 | 450 |
| 2 | NiO/NiFe/Co | 5.28 | 4.5 | 15 | 225 | 550 | 350 |
| 3 | NiO/($Fe_2O_3$) or ($Fe_3O_4$)/NiFe | 5.07 | 4.72 | 7 | 325 | 375 | 120 |
| 4 | NiO/($Fe_2O_3$) or ($Fe_3O_4$)/Co | 5.58 | 5.4 | 3.2 | 375 | 550 | 250 |
| 5 | NiO/($Fe_2O_3$) or ($Fe_3O_4$)/CoFe | 5.54 | 5.42 | 2.1 | 375 | 500 | 225 |

Discussion

It can be seen from Chart A that the preferred examples are Examples 4 and 5 which, after annealing, had a magnetoresistive coefficient (dr/R) of 5.4% and 5.42% respectively. Accordingly, the preferred pinning layer is either cobalt (Co) or cobalt iron (CoFe). The pinned layer structure may be a single pinned layer or an antiparallel coupled pinned layer structure. The difference between Examples 2 and 3 is that in Example 3 the pinning layer structure includes reactively sputter deposited first and second films of nickel oxide (NiO) and iron oxide ($Fe_2O_3$) or ($Fe_3O_4$). An improvement in the magnetoresistive coefficient (dr/R) after annealing in Example 3 is seen to be 4.72% as compared to 4.5% in Example 2. The improvements in magnetoresistive coefficients (dr/R) and the thermal stability of the sensor when subjected to high temperature annealing is due to an exchange coupling field ($H_{EX}$) which is substantially greater than the coercivity ($H_C$) of the pinned layer structure.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

I claim:

1. A magnetic read head comprising:
   a read sensor including an antiferromagnetic pinning layer structure that includes:
   a first film of reactively sputtered nickel oxide (NiO); and
   a second film of reactively sputtered iron oxide ($Fe_2O_3$) or ($Fe_3O_4$) on the first film;
   the read sensor further including a ferromagnetic pinned layer consisting of cobalt iron (CoFe) or cobalt (Co) in direct contact with said second film of the pinning layer structure.

2. A magnetic read head as claimed in claim 1 including:
the sensor further including:
a nonmagnetic metal spacer layer on the pinned layer structure;
a ferromagnetic free layer structure on the spacer layer; and
a nonmagnetic metal cap layer on the free layer structure; and
the sensor having first and second side edges;
first and second hard bias and lead layers abutting the first and second side edges of the sensor;
first and second nonmagnetic nonconductive read gap layers;
the sensor and the first and second hard bias and lead layers being located between the first and second read gap layers;
ferromagnetic first and second shield layers; and
the first and second read gap layers being located between the first and second shield layers.

3. A magnetic head assembly including a read head and a write head and an air bearing surface (ABS) comprising:
the write head including:
ferromagnetic first and second pole piece layers;
each of the first and second pole piece layers having a yoke portion located between a pole tip portion and a back gap portion;
a nonmagnetic write gap layer located between the pole tip portions of the first and second pole piece layers;
an insulation stack with at least one coil layer embedded therein located between the yoke portions of the first and second pole piece layers; and
the first and second pole piece layers being connected at their back gap portions; and the read head including:
a read sensor having first and second side edges;
first and second hard bias and lead layer structures connected to the first and second side edges of the read sensor;
nonmagnetic nonconductive first and second read gap layers;
the read sensor and the first and second hard bias and lead layers being located between the first and second read gap layers;
a ferromagnetic first shield layer; and
the first and second read gap layers being located between the first shield layer and the first pole piece layer; and
the read sensor including:
the read sensor including an antiferromagnetic pinning layer structure that includes:
a first film of reactively sputtered nickel oxide (NiO); and
a second film of reactively sputtered iron oxide ($Fe_2O_3$) or ($Fe_3O_4$) on the first film; and
the read sensor further including a ferromagnetic pinned layer consisting of cobalt iron (CoFe) or cobalt (Co) in direct contact with to said second film of the pinning layer structure.

4. A magnetic head assembly as claimed in claim 3 including:
the read head further including:
a ferromagnetic second shield layer;
a nonmagnetic nonconductive separation layer; and
the separation layer being located between the second shield layer the first pole piece layer.

5. A magnetic head assembly as claimed in claim 3 including:
the sensor further including:
a nonmagnetic metal spacer layer on the pinned layer structure;
a ferromagnetic free layer structure on the spacer layer; and
a nonmagnetic metal cap layer on the free layer structure; and
the sensor having first and second side edges;
first and second hard bias and lead layers abutting the first and second side edges of the sensor;
first and second nonmagnetic nonconductive read gap layers;
the sensor and the first and second hard bias and lead layers being located between the first and second read gap layers;
ferromagnetic first and second shield layers; and
the first and second read gap layers being located between the first and second shield layers.

6. A magnetic disk drive having at least one slider that has an air bearing surface (ABS), the slider supporting at least one magnetic head assembly that includes a read head and a write head, the disk drive comprising:
the write head including:
first and second pole piece layers;
each of the first and second pole piece layers having a yoke portion located between a pole tip portion and a back gap portion;
a nonmagnetic write gap layer located between the pole tip portions of the first and second pole piece layers;
an insulation stack with at least one coil layer embedded therein located between the yoke portions of the first and second pole piece layers; and
the first and second pole piece layers being connected at their back gap portions; and
the read head including:
a read sensor having first and second side edges;
first and second hard bias and lead layer structures connected to the first and second side edges of the read sensor;
nonmagnetic nonconductive first and second read gap layers;
the read sensor and the first and second hard bias and lead layers being located between the first and second read gap layers;
a ferromagnetic first shield layer; and
the first and second read gap layers being located between the first shield layer and the first pole piece layer; and
the read sensor including an antiferromagnetic pinning layer structure that includes:
a first film of reactively sputtered nickel oxide (NiO); and
a second film of reactively sputtered iron oxide ($Fe_2O_3$) or ($Fe_3O_4$) on the first film; and
the read sensor further including a ferromagnetic pinned layer consisting of cobalt iron (CoFe) or cobalt (Co) in direct contact with to said second film of the pinning layer structure;
a housing;
a magnetic disk rotatably supported in the housing;
a support mounted in the housing for supporting the magnetic head assembly with its ABS facing the magnetic disk so that the magnetic head assembly is in a transducing relationship with the magnetic disk;

means for rotating the magnetic disk;

positioning means connected to the support for moving the magnetic head assembly to multiple positions with respect to said magnetic disk; and processing means connected to the magnetic head assembly, to the means for rotating the magnetic disk and to the positioning means for exchanging signals with the magnetic head assembly, for controlling movement of the magnetic disk and for controlling the position of the magnetic head assembly.

7. A magnetic disk drive as claimed in claim 6 including:

the read head further including:
 a ferromagnetic second shield layer;
 a nonmagnetic nonconductive separation layer; and
 the separation layer being located between the second shield layer the first pole piece layer.

8. A magnetic disk drive as claimed in claim 7 including:

the sensor further including:
 a nonmagnetic metal spacer layer on the pinned layer structure;
 a ferromagnetic free layer structure on the spacer layer; and
 a nonmagnetic metal cap layer on the free layer structure; and the sensor having first and second side edges;

first and second hard bias and lead layers abutting the first and second side edges of the sensor;

first and second nonmagnetic nonconductive read gap layers;

the sensor and the first and second hard bias and lead layers being located between the first and second read gap layers;

ferromagnetic first and second shield layers; and the first and second read gap layers being located between the first and second shield layers.

* * * * *